(12) United States Patent
Lee et al.

(10) Patent No.: US 9,627,327 B2
(45) Date of Patent: Apr. 18, 2017

(54) SEMICONDUCTOR PACKAGE AND METHOD OF MANUFACTURING THE SAME

(71) Applicant: Samsung Electronics Co., Ltd., Suwon-si, Gyeonggi-do (KR)

(72) Inventors: Baik-woo Lee, Gwangmyeong (KR); Dong-hun Lee, Hwaseong (KR); Jae-gwon Jang, Hwaseong (KR); Chul-yong Jang, Suwon (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/815,937

(22) Filed: Jul. 31, 2015

(65) Prior Publication Data
US 2016/0099218 A1 Apr. 7, 2016

(30) Foreign Application Priority Data

Oct. 6, 2014 (KR) ........................ 10-2014-0134473

(51) Int. Cl.
*H01L 21/00* (2006.01)
*H01L 23/552* (2006.01)
(Continued)

(52) U.S. Cl.
CPC .......... *H01L 23/552* (2013.01); *H01L 21/561* (2013.01); *H01L 21/565* (2013.01); *H01L 21/78* (2013.01); *H01L 24/97* (2013.01); *B29C 70/78* (2013.01); *B29K 2063/00* (2013.01); *B29L 2009/005* (2013.01); *B29L 2031/3481* (2013.01); *H01L 25/0652* (2013.01); *H01L 25/18* (2013.01); *H01L 2224/16227* (2013.01);

*H01L 2224/48091* (2013.01); *H01L 2224/48145* (2013.01); *H01L 2224/48227* (2013.01); *H01L 2224/97* (2013.01); *H01L 2225/0651* (2013.01); *H01L 2225/06506* (2013.01); *H01L 2924/15313* (2013.01); *H01L 2924/181* (2013.01)

(58) Field of Classification Search
CPC ........... H01L 2924/14; H01L 2924/181; H01L 2924/3025
USPC ................................ 257/659, 704; 438/127
See application file for complete search history.

(56) References Cited

U.S. PATENT DOCUMENTS 5,837,086 A 11/1998 Leeb et al.
7,342,303 B1 3/2008 Berry et al.
(Continued)

FOREIGN PATENT DOCUMENTS

JP 1996288686 11/1996
JP 2003273571 9/2003
(Continued)

*Primary Examiner* — Sheila V. Clark
(74) *Attorney, Agent, or Firm* — Renaissance IP Law Group LLP

(57) ABSTRACT

Provided is a method of manufacturing a semiconductor package. The method includes mounting a semiconductor device on a substrate; disposing a mold on the substrate, wherein the mold is formed to cover the semiconductor device such that at least one inner side surface of the mold has a slope; providing a molding material into the mold to encapsulate the semiconductor device; removing the mold from the substrate; and forming an electromagnetic shielding (EMS) layer to cover a top surface and side surfaces of the molding material.

13 Claims, 34 Drawing Sheets

(51) Int. Cl.
*H01L 21/56* (2006.01)
*H01L 21/78* (2006.01)
*H01L 23/00* (2006.01)
B29C 70/78 (2006.01)
B29K 63/00 (2006.01)
B29L 9/00 (2006.01)
B29L 31/34 (2006.01)
H01L 25/065 (2006.01)
H01L 25/18 (2006.01)

(56) References Cited

U.S. PATENT DOCUMENTS

| | | | |
|---|---|---|---|
| 7,745,910 B1 | 6/2010 | Olson et al. | |
| 7,772,046 B2 | 8/2010 | Pagaila et al. | |
| 8,093,690 B2 | 1/2012 | Ko et al. | |
| 8,212,340 B2 | 7/2012 | Liao | |
| 2006/0071318 A1 | 4/2006 | Yamamura | |
| 2006/0113642 A1* | 6/2006 | Kajiki | H01L 21/565 257/659 |
| 2010/0172116 A1 | 7/2010 | Yorita et al. | |
| 2011/0298111 A1 | 12/2011 | Kim | |
| 2015/0130034 A1* | 5/2015 | Chien | H01L 24/96 257/659 |
| 2015/0170988 A1* | 6/2015 | Watanabe | H01L 23/552 257/659 |
| 2016/0035680 A1* | 2/2016 | Wu | H01L 23/552 257/659 |

FOREIGN PATENT DOCUMENTS

| | | |
|---|---|---|
| JP | 2005161695 | 6/2005 |
| JP | 2008288610 | 11/2008 |
| KR | 0285558 | 4/2001 |

\* cited by examiner

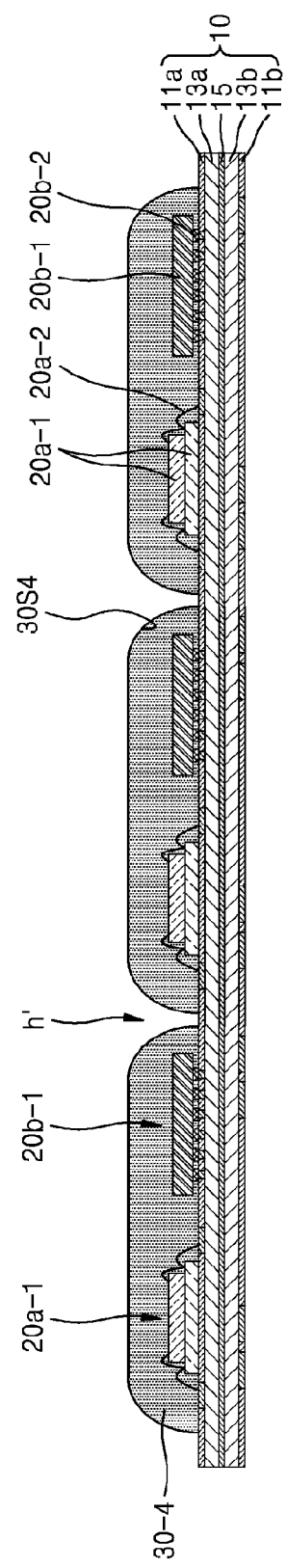

SEMICONDUCTOR PACKAGE AND METHOD OF MANUFACTURING THE SAME

CROSS-REFERENCE TO RELATED APPLICATION

This application claims the benefit of Korean Patent Application No. 10-2014-0134473, filed on Oct. 6, 2014, in the Korean Intellectual Property Office, the disclosure of which is incorporated herein in its entirety by reference.

BACKGROUND

Embodiments relate to a semiconductor package and a method of manufacturing the same, and more particularly, to a semiconductor package and a method of manufacturing the same, which may improve electromagnetic shielding (EMS) characteristics.

A frequency generated by a semiconductor device may disturb operations of other semiconductor devices and cause malfunctions. To prevent the malfunctions, an EMS layer configured to shield EM waves (EMW) generated by each semiconductor device may be formed in a semiconductor package.

In recent years, since semiconductor devices (e.g., a radio-frequency (RF) device, a Large-Scaled Integrated circuit (LSI), and a memory), which are used in various semiconductor devices, operate at higher frequencies, more attention is being paid to shielding EMW generated by each of the semiconductor devices.

SUMMARY

An embodiment includes a method including mounting a semiconductor device on a substrate; disposing a mold on the substrate, wherein the mold is formed to cover the semiconductor device such that at least one inner side surface of the mold has a slope; providing a molding material into the mold to encapsulate the semiconductor device; removing the mold from the substrate; and forming an electromagnetic shielding (EMS) layer to cover a top surface and side surfaces of the molding material.

An embodiment includes a method of manufacturing a semiconductor package, the method comprising: mounting a plurality of semiconductor devices on a substrate; disposing a mold on the substrate, wherein the mold includes a plurality of unit molding spaces that are formed to cover the plurality of semiconductor devices, respectively; injecting a molding material into the plurality of unit molding spaces to encapsulate the plurality of semiconductor devices; removing the mold from the substrate; cutting the substrate such that the plurality of semiconductor devices encapsulated by the molding material are separated into discrete packages; and forming an electromagnetic shielding (EMS) layer to cover top surfaces and side surfaces of the discrete packages, wherein, among the plurality of unit molding spaces, adjacent unit molding spaces are at least partially separated from one another by a plurality of walls that protrude from an inner top surface of the mold and narrow downward.

An embodiment includes a method of manufacturing a semiconductor package, the method comprising: disposing a mold on a substrate including a semiconductor device, the mold including a wall that extends towards the substrate when the mold is disposed on the substrate, the wall including a slope inclined towards the semiconductor device; providing a molding material into the mold to encapsulate the semiconductor device; removing the mold from the substrate; and forming an electromagnetic shielding (EMS) layer to cover a top surface and side surfaces of the molding material.

BRIEF DESCRIPTION OF THE DRAWINGS

Embodiments will be more clearly understood from the following detailed description taken in conjunction with the accompanying drawings in which:

FIGS. 7A to 7F are cross-sectional views illustrating a method of manufacturing a semiconductor package, according to some embodiments;

DETAILED DESCRIPTION OF THE EMBODIMENTS

Figure 1A:
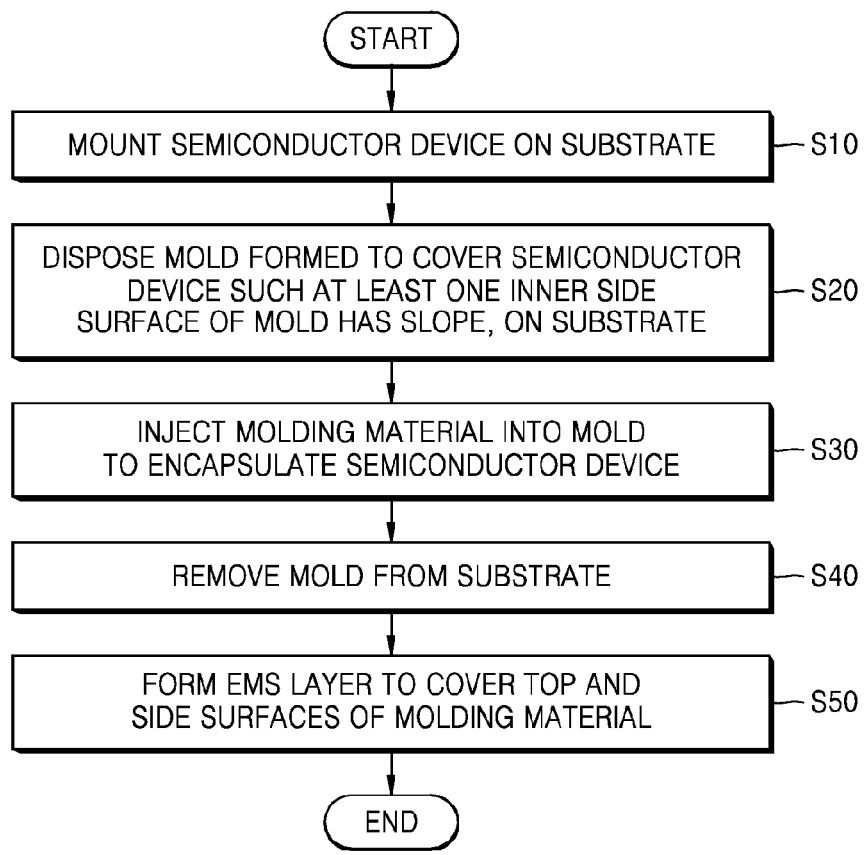
FIGS. 1A and 1B are flowcharts illustrating a method of manufacturing a semiconductor package, according to some embodiments.

Embodiments will be described more fully hereinafter with reference to the accompanying drawings, in which particular embodiments are shown. Embodiments may, however, take many different forms and should not be construed as limited to the particular embodiments set forth herein. Rather, these embodiments are provided so that this disclosure will be thorough and complete, and will fully convey the scope to those skilled in the art. In the drawings, the sizes of layers and regions may be exaggerated for clarity.

It will be understood that when an element or layer is referred to as being "on" or "in contact with" another element or layer, it can be directly on or in contact with the other element or layer or intervening elements or layers may be present. In contrast, when an element is referred to as being "directly on" or "in direct contact with" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

It will be understood that, although the terms "first", "second", etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs.

As used herein, the term "and/or" includes any and all combinations of one or more of the associated listed items. Expressions such as "at least one of," when preceding a list of elements, modify the entire list of elements and do not modify the individual elements of the list.

FIG. 1A is a flowchart illustrating a method of manufacturing a semiconductor package, according to some embodiments. Referring to FIG. 1A, to begin with, at least one semiconductor device may be mounted on a substrate (S10). Thereafter, a mold that is formed to define the at least one semiconductor device such that at least one inner side surface of the mold has a slope may be disposed on the substrate (S20). After that, a molding material may be injected into the mold to encapsulate the semiconductor device (S30). After the molding material is fixed, the mold may be removed from the substrate (S40). Afterwards, an electromagnetic shielding (EMS) layer may be formed to cover a top surface and side surfaces of the molding material (S50). The side surfaces of the molding material formed by the mold of which the at least one inner side surface has a slope may have a slope. Thus, even if an EMS material for forming the EMS layer is coated on a top surface of the molding material, an EMS layer may be formed also on the side surfaces of the molding material to a uniform thickness. A detailed method of manufacturing the semiconductor package according to some embodiments will be described later with reference to FIGS. 2A to 2G.

Figure 1B:
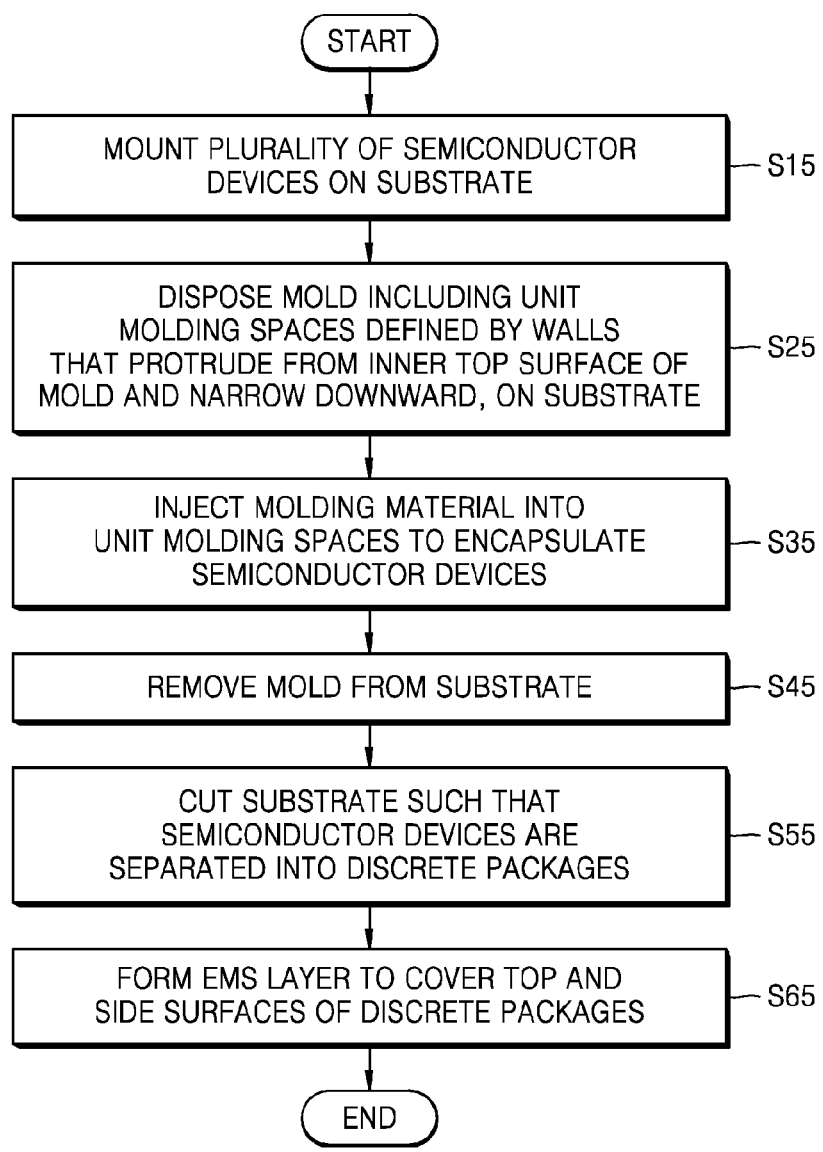

FIG. 1B is a flowchart illustrating a method of manufacturing a semiconductor package, according to some embodiments. As shown in FIG. 1B, the method of manufacturing the semiconductor package is similar to the method shown in FIG. 1A except that multiple semiconductor packages are manufactured at the same time.

Referring to FIG. 1B, to begin with, multiple semiconductor devices may be mounted on a substrate (S15). Thereafter, a mold including multiple unit molding spaces that are formed to respectively define the plurality of semiconductor devices may be disposed on the substrate (S25). In this case, adjacent unit molding spaces among the unit molding spaces may be divided from one another by walls that may protrude from an inner top surface of the mold and narrow downward. After that, a molding material may be injected into the unit molding spaces to encapsulate the semiconductor devices (S35). Afterwards, the mold may be removed from the substrate (S45). Next, the substrate and the molding material may be cut such that the plurality of semiconductor devices encapsulated by the molding material may be separated into discrete semiconductor packages (S55). Thereafter, an EMS layer may be formed to cover top surfaces and side surfaces of the discrete packages (S65), thereby completing the manufacture of semiconductor packages having an EMS layer. The method of manufacturing a semiconductor package according to some embodiments will be described in detail below with reference to FIGS. 2A to 2G.

FIGS. 2A to 2G are cross-sectional views illustrating a method of manufacturing a semiconductor package 100 according to some embodiments. FIGS. 2A to 2G illustrate the method of manufacturing multiple semiconductor packages, as shown in FIG. 1B, but the method shown in FIGS. 2A to 2G may be applied likewise to the method of manufacturing a discrete semiconductor package, as shown in FIG. 1A. In this case, an operation of separating semiconductor devices into discrete semiconductor packages, as will be described with reference to FIG. 2E, may be omitted.

Figure 2A:
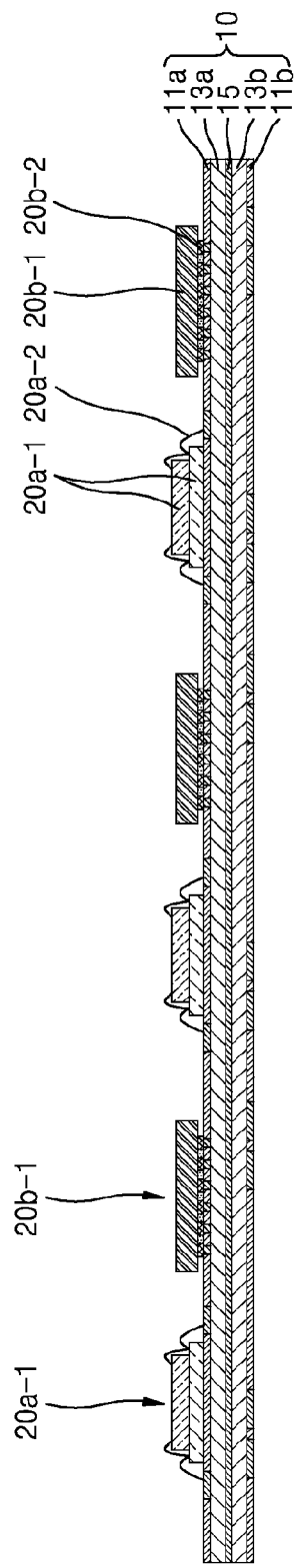
FIGS. 2A to 2G are cross-sectional views illustrating a method of manufacturing a semiconductor package, according to some embodiments.

FIG. 2A illustrates an example of the substrate mounting operation S15 of FIG. 1B. At least one semiconductor device, for example, a memory device 20a-1 and a logic device 20b-1, may be mounted on a substrate 10.

The substrate 10 may be a printed circuit board (PCB) and have a multilayered structure. For example, the substrate 10 may have a structure formed by sequentially stacking from top to bottom a first interconnection layer 11a, a first insulating layer 13a, a ground layer 15, a second insulating layer 13b, and a second interconnection layer 11b. Although FIG. 2A illustrates an example in which the substrate 10 is a stack structure including five layers, other embodiments not limited thereto. The substrate 10 may include one or at least three interconnection layers and/or one or at least three insulating layers. In some embodiments, the substrate 10 may be formed by sequentially stacking from top to bottom a metal layer, an insulating layer, and a ground layer. In some embodiments, the substrate 10 may include at least one of an organic substrate, a ceramic substrate, an inorganic substrate, a glass substrate, or a semiconductor substrate.

The first interconnection layer 11a may include a circuit pattern to be electrically connected to the memory device 20a-1, and the second interconnection layer 11b may include a circuit pattern configured to electrically connect the memory device 20a-1 and the logic device 20b-1 with an external circuit (not shown). The first and second interconnection layers 11a and 11b may include a metal material. The first insulating layer 13a and/or the second insulating layer 13b may include an epoxy resin (e.g., FR-4). The ground layer 15 may be configured to ground electric signals and include a metal. Although FIG. 2A illustrates an example where the ground layer 15 is inserted into a central portion of the substrate 10, other embodiments are not limited thereto, and the ground layer 15 may be formed on a top surface or a bottom surface of the substrate 10 or formed as any layer of the substrate 10.

The memory device 20a1 may be electrically connected to the substrate 10 by a wire 20a2. Also, the logic device 20b1 may be electrically connected to the substrate 10 by a connection member, for example, a bump 20b2. Although wires and bumps have been used as examples for specific components, wires, bumps, or other connection members may be used with any type of device.

FIGS. 2A to 2G illustrate a case in which two semiconductor devices, that is, the memory device 20a1 and the logic device 20b1, are mounted on the substrate 10, but other embodiments are not limited thereto. Since other embodiments are not limited in the kinds and number of semiconductor devices mounted on the substrate 10, other embodiments may include one or at least three of each of an RF device, an LSI device, a logic device, and a memory device mounted on the substrate 10.

Hereinafter, the same reference numerals are used to denote the same elements and thus, detailed descriptions thereof are omitted for brevity.

Figure 2B:
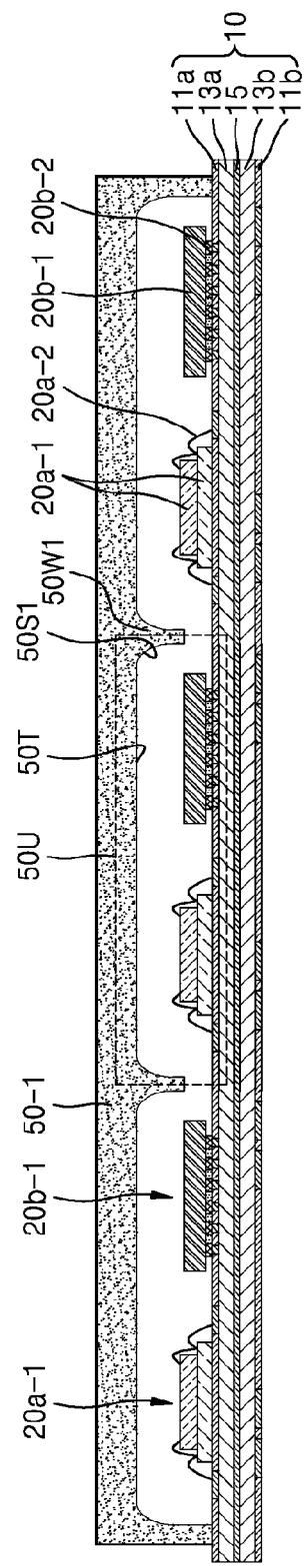

FIG. 2B illustrates an example of the operation S25 of disposing the mold on the substrate, as shown in FIG. 1B. A mold 50-1 may be disposed on the substrate 10 to define semiconductor devices, namely, the memory and logic devices 20a1 and 20b1, disposed on the substrate 10 in the mold 50-1. The mold 50-1 may include multiple unit molding spaces 50U, which may be divided from one another by multiple walls 50W1, which may protrude from an inner top surface 50T of the mold 50-1 and narrow downward. As the walls 50W1 of the unit molding spaces 50U extend from the inner top surface 50T of the mold 50-1 to the substrate 10, the width of the walls 50W1 may be reduced. Thus, an inner side surface of each of the unit molding spaces 50U may have a slope, for example, a round shape 50S 1.

The walls 50W1 may be spaced apart from the substrate 10. Thus, adjacent unit molding spaces 50U of the unit molding spaces 50U may communicate with one another. That is, in an embodiment, a space defined between the mold 50-1 and the substrate 10 may be continuous. However, in other embodiments, the entire space defined between the mold 50-1 and the substrate 10 need not be continuous. For example, some embodiments, one or more of the walls 50W1 may extend to the substrate 10.

Figure 2C:
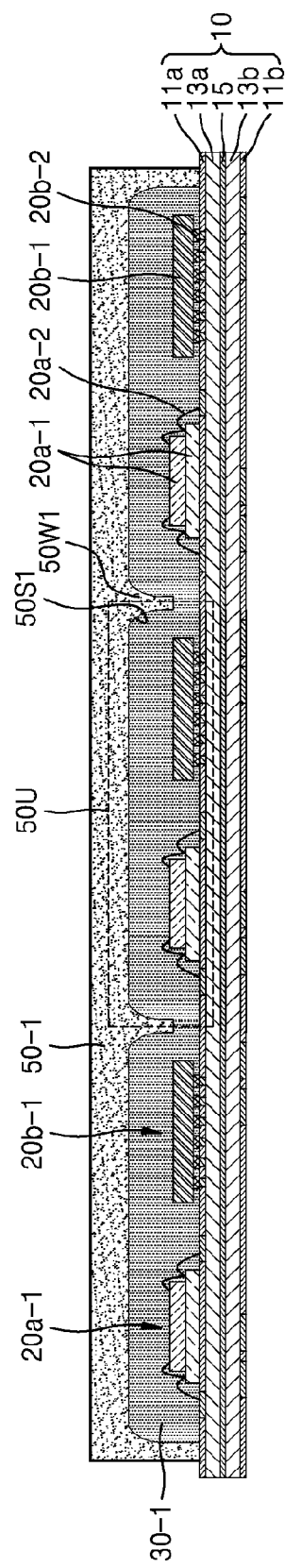

FIG. 2C illustrates an example of the operation S35 of injecting a molding material into the mold, as shown in FIG. 2B. The memory device 20a1 and the logic device 20b1 may be encapsulated by injecting a molding material 30-1 into the unit molding spaces 50U that are defined by the substrate 10 and the mold 50-1. As described above, adjacent unit molding spaces 50U of the unit molding spaces 50U may communicate with one another, and when a molding material is injected into one unit molding space 50U, the molding material may be injected into another unit molding space 50U. However, if the unit molding spaces 50U are not connected, the molding material may be injected in multiple locations into the unit molding spaces 50U.

The molding material 30-1 may protect the memory device 20a1, the wire 20a2, the logic device 20b1, the bump 20b2, or other similar structures from heat, moisture, and impact. Thus, the molding material 30-1 may be formed to encapsulate the memory device 20a1, the wire 20a2, the logic device 20b1, and the bump 20b2 and cover a top surface of the substrate 10. In some embodiments, the molding material 30-1 may be an epoxy molding compound (EMC).

Figure 2D:
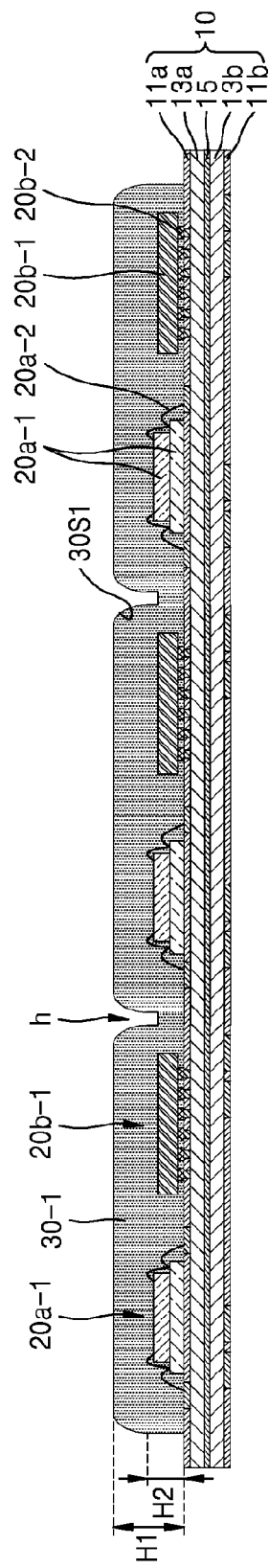

FIG. 2D illustrates an example of the operation S45 of removing the mold, as shown in FIG. 1B. When the molding material 30-1 that is injected into the unit molding spaces 50U is fixed, the mold 50-1 may be removed from the substrate 10. After the mold 50-1 is removed, the molding material 30-1 may be formed on the substrate 10 to encapsulate the semiconductor devices, namely, the memory and logic devices 20a1 and 20b1. The molding material 30-1 may have a groove "h," which may be formed along a boundary line by which discrete semiconductor packages are separated. That is, a top surface of the molding material 30-1 may be disposed at a first height H1 from the top surface of the substrate 10, and a side surface of the molding material 30-1 may have a round shape 30S1 along the inner side surface of the mold 50-1 of FIG. 2C from the first height H1 to a second height H2 that is lower than the first height H1.

Figure 2E:
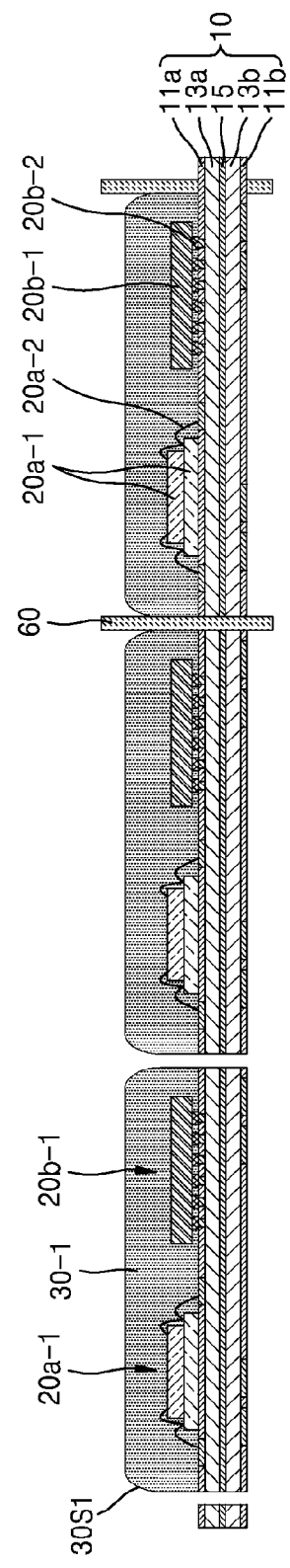

FIG. 2E illustrates an example of the operation S55 of separating the semiconductor devices, namely, the memory and logic devices 20a1 and 20b1, into the discrete semiconductor packages, as shown in FIG. 1B. The substrate 10 and the molding material 30-1 may be cut such that the semiconductor devices, namely, the memory and logic devices 20a1 and 20b1, encapsulated by the molding material 30-1 are separated into discrete semiconductor packages. In this case, a cutter, for example, a blade 60 or a laser drill, may be used to cut the semiconductor devices, namely, the memory and logic devices 20a1 and 20b1, into discrete semiconductor packages. Also, the process of separating the semiconductor devices, namely, the memory and logic devices 20a1 and 20b1, into discrete semiconductor packages may be simultaneously or sequentially performed.

In general, when the process separating the semiconductor devices, namely, the memory and logic devices 20a1 and 20b1, into discrete semiconductor package is performed, a process of forming grooves between the discrete semiconductor packages may be further included to facilitate the separation process. However, in the method of manufacturing semiconductor packages, according to the inventive concept, the grooves "h" may be formed as the boundary lines by which the discrete semiconductor packages are separated by the walls 50W1 between the unit molding spaces 50U during the operation S35 of forming the molding material. Thus, even if an additional process of forming the grooves "h" between the discrete semiconductor packages is not performed, a batch process capable of easily separating the discrete semiconductor packages may be performed.

Figure 2F:
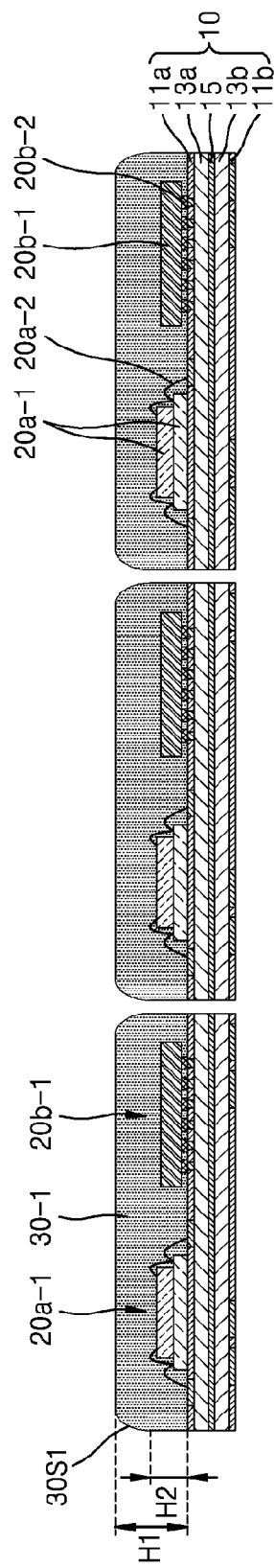

FIG. 2F illustrates an example of a state in which semiconductor devices, namely, the memory and logic devices 20a1 and 20b1, are separated into the discrete semiconductor packages. The top surface of the molding material 30-1 may be disposed at the first height H1 from the top surface of the substrate 10, and the side surface of the molding material 30-1 may have a slope from the first height H1 to the second height H2 that is lower than the first height H1. Specifically, the side surface of the molding material 30-1 may have the round shape 30S1 having a discontinuous slope from the first height H1 to the second height H2. The side surface of the molding material 30-1 may be perpendicular to the substrate 10 from the top surface of the substrate 10 to the second height H2. That is, the side surface of the molding material 30-1 may be cut by the blade 60 of FIG. 2E from the substrate 10 to the second height H2 and perpendicular to the substrate 10. In some embodiments, an additional polishing process may be performed on the side surface of the molding material 30-1 using the blade 60 of FIG. 2E, or by some other process. In this case, an additional slope may be formed by the blade 60 of FIG. 2E from the substrate 10 to the second height H2.

Figure 2G:
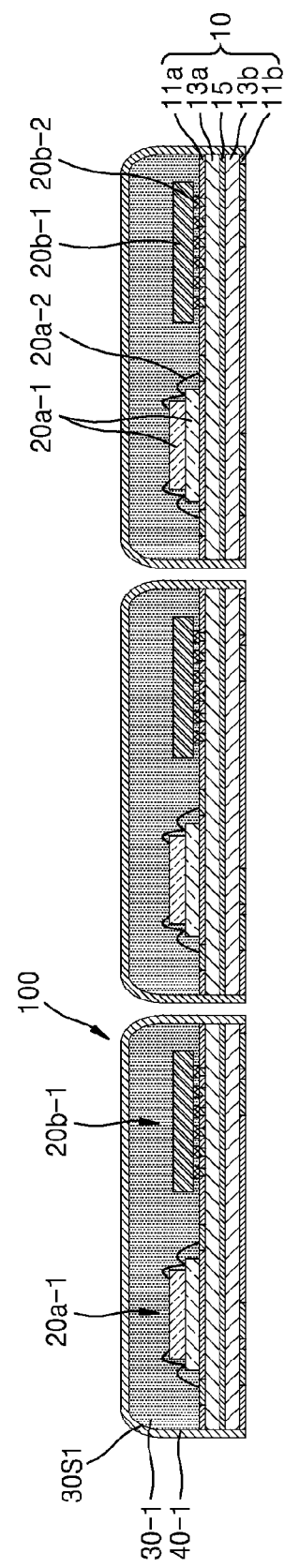

FIG. 2G illustrates an example of the operation S65 of forming the EMS layer, as shown in FIG. 1B. An EMS material may be coated to cover top and side surfaces of the discrete semiconductor packages. In this case, an EMS layer 40-1 may be formed by using a sputtering process, a spraying process, a plating process, or the like.

The EMS layer 40-1 may be formed on the substrate 10 to cover a side surface of the substrate 10 and an outer surface of the molding material 30-1 formed on the substrate 10, and expose a bottom surface of the substrate 10. Thus, a side surface of the EMS layer 40-1 may be roundly formed along the round shape 30S1 of the side surface of the molding material 30-1. Thus, the EMS layer 40-1 formed on the side surface of the molding material 30-1 may be formed to such a sufficient thickness as to improve EMS characteristics.

In many cases, a semiconductor package, including a molding material formed on a substrate, may have a hexahedral shape. That is, there are many cases in which a top surface of the molding material may be perpendicular to a side surface thereof. This result may be obtained by performing a typical method of manufacturing a semiconductor package, which includes disposing several semiconductor devices on one substrate, forming a molding material to a uniform thickness, and simply separating the semiconductor devices into semiconductor packages by using a blade, in order to produce the semiconductor packages in larger quantities.

However, a semiconductor package having a hexahedral shape may reduce the efficiency of an EMS layer covering an outer surface of the semiconductor package. The EMS layer may include a layer formed on the outer surface of the semiconductor package to prevent a malfunction in a semiconductor device due to external EM waves (EMW). Since some semiconductor devices may use higher frequencies, the demand for semiconductor packages having EMS layers capable of effectively blocking external EMW has further increased.

The EMS layer may be formed by coating an EMS material on a substrate and an outer surface of a molding material formed on the substrate. However, when the molding material has a hexahedral shape, since the EMS layer formed on a top surface of the molding material has a different thickness from the EMS layer formed on a side surface of the molding material, EMS characteristics may be degraded. A thickness difference between the top surface and side surface of the molding material may occur because an EMS material source is typically disposed over the molding material during a process of coating an EMS material. In particular, when the molding material has angled corners, the EMS material may accumulate into the corners of the molding material so that a thickness of the EMS layer may be reduced toward a lower portion of the side surface of the molding material. As a result, since the EMS layer is not formed to a sufficient thickness, the EMS layer may lose an EMS function.

Thus, in the semiconductor package 100 formed using a method of manufacturing a semiconductor device, according to an embodiment, the side surface of the molding material 30-1 may have a slope, for example, the round shape 30S1. Thus, even if a typical apparatus of disposing an EMS material source over the molding material 30-1 is used, the EMS layer 40-1 may be formed to a sufficient thickness on the top surface and the side surface of the molding material 30-1. Also, some embodiments may be practically advantageous in terms of time and costs because a method of partially modifying a shape of the mold 50-1 may be used without introducing new equipment to forming a slope on the side surface (i.e., 30S1) of the molding material 30-1 or performing an additional process.

In some embodiments, the EMS layer 40-1 may be electrically connected to the ground layer 15 formed in the substrate 10.

In some embodiments, the EMS layer 40-1 may include a conductive material. Thus, the EMS layer 40-1 may include at least one of a metal, a conductive metal-polymer composite, a metal paste, or the like. For example, the EMS layer 40-1 may include a conductive metal-polymer composite including polyurethane and silver (Ag) particles.

In some embodiments, the EMS layer 40-1 may include at least one conductive material layer. That is, the EMS layer 40-1 may be a single metal layer or a multilayered metal structure including multiple metal layers. For example, the EMS layer 40-1 may include a multilayered metal structure formed by sequentially stacking from top to bottom an adhesion layer, a conductive material layer, and a protection layer. In this case, the adhesion layer may include nickel (Ni), copper (Cu), titanium (Ti), chromium (Cr), stainless steel, or a combination thereof. The adhesion layer may be formed using an electroless plating process. Also, the conductive material layer may include copper, silver, or a combination thereof. The conductive material layer may be formed using an electroplating process. Furthermore, the protection layer may include nickel or stainless steel. Although embodiments have been described with particular materials, those materials are merely examples and in other embodiments, other materials or combinations of materials may be used.

FIGS. 2B and 2C illustrate an example where the inner side surface of each of the unit molding spaces 50U of the mold 50-1 has a round shape, but other embodiments are not limited thereto. In some embodiments, the inner side surface of each of the unit molding spaces 50U of the mold 50-1 may be a surface having at least one predetermined slope, as described in detail later with reference to FIGS. 5A to 6B.

Also, FIGS. 2B and 2C illustrate an example where the wall 50W1 formed between adjacent unit molding spaces 50U in the mold 50-1 is not in contact with the substrate 10, but other embodiments are not limited thereto. The walls 50W1 of the unit molding spaces 50U may extend from the inner top surface of the mold 50-1 and contact the top surface of the substrate 10, as described in detail with reference to FIGS. 7A to 9B.

Figure 3A:
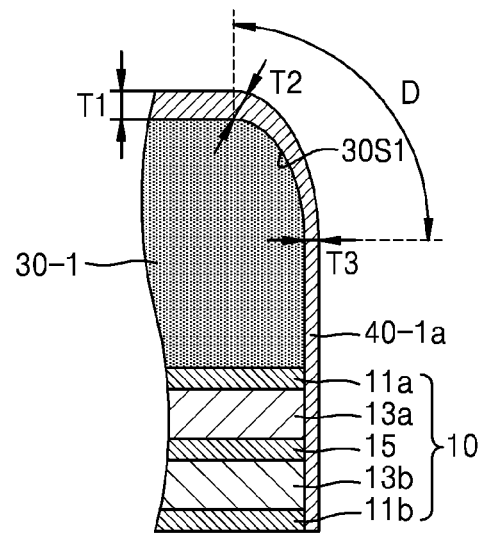
FIGS. 3A and 3B are cross-sectional views for comparing a thickness of a top surface of an electromagnetic shielding (EMS) layer with a thickness of a side surface thereof in a semiconductor package according to some embodiment.
Figure 3B:
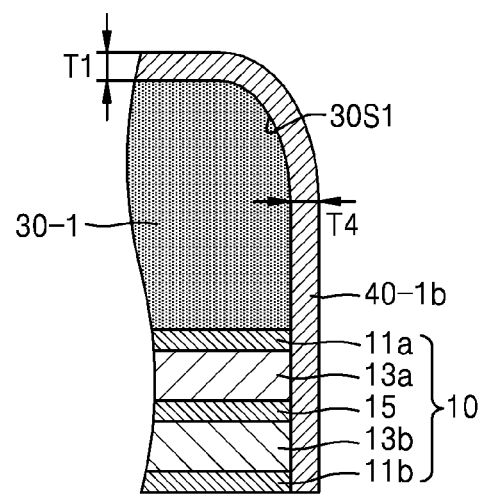

FIGS. 3A and 3B are cross-sectional views for comparing a thickness of top surfaces of EMS layers 40-1a and 40-1b with a thickness of side surfaces thereof in a semiconductor package 100 according to some embodiments. Referring to FIG. 3A, in the semiconductor package 100 according to some embodiments, the EMS layer 40-1a formed in a domain D having a slope on a side surface of the molding material 30-1 may have a first thickness T1 on a top surface of the molding material 30-1 and have a continuous thickness range from a second thickness T2 corresponding to a maximum thickness to a third thickness T3 corresponding to a minimum thickness on the side surface of the molding material 30-1.

When the side surface of the molding material 30-1 has a slope, the EMS layer 40-1a may be more easily formed on an outer surface of the molding material 30-1 and a side surface of the substrate 10. However, in this case, when an EMS material source is present over the semiconductor package 100, a thickness of the EMS layer 40-1a formed on the side surface of the molding material 30-1 may be less than a thickness of the EMS layer 40-1a formed on the top surface of the molding material 30-1.

Referring to FIG. 3B, in the semiconductor package 100 according to some embodiments, a top thickness T1 of the EMS layer 40-1b may be equal to a side thickness T4 of the EMS layer 40-1b.

However, the thicknesses of the EMS layer 40-1*a* formed on the top surface and side surface of the molding material 30-1 according to some embodiments are not limited to the embodiments shown in FIGS. 3A and 3B. Accordingly, embodiments may be include a semiconductor package including an EMS layer 40-1 formed on a top surface and a side surface of the molding material 30-1 and a side surface of the substrate 10.

Figure 4A:
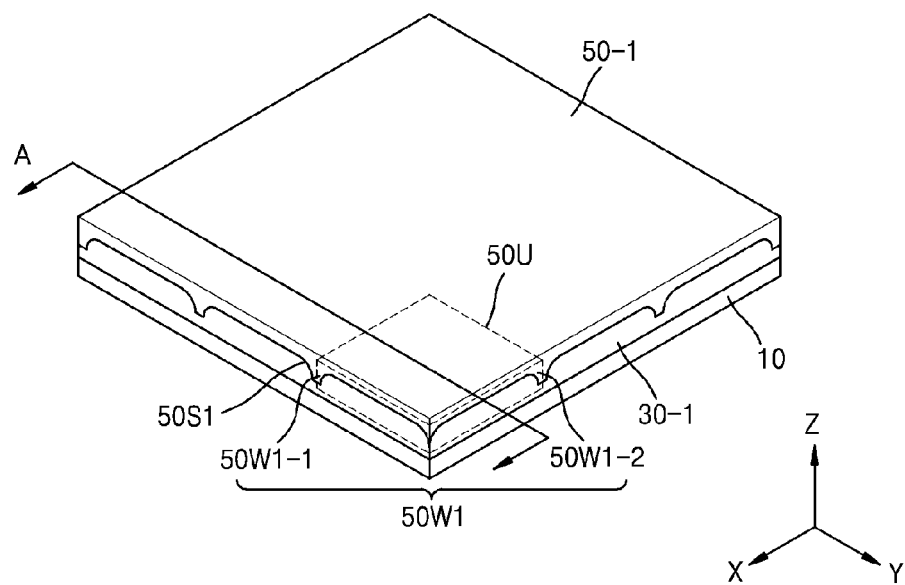
FIGS. 4A to 4C are perspective views illustrating a method of manufacturing a semiconductor package, according to some embodiments.
Figure 4B:
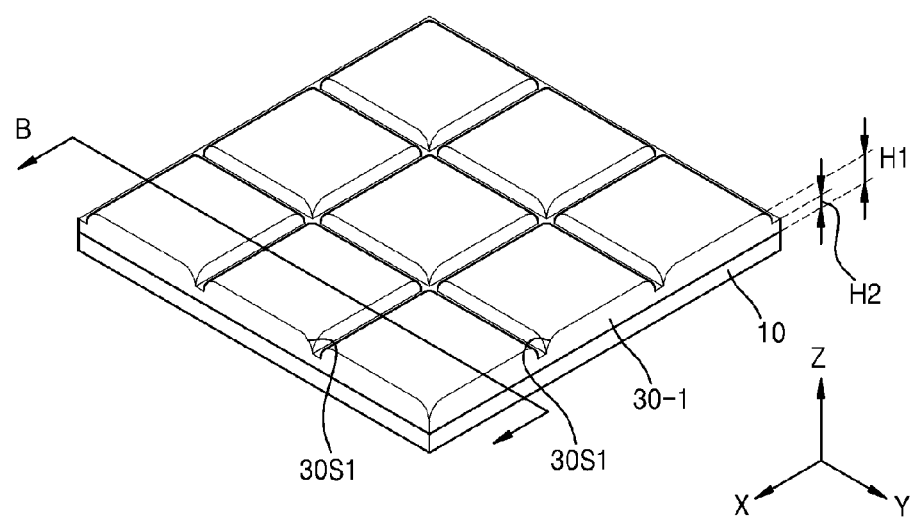
Figure 4C:
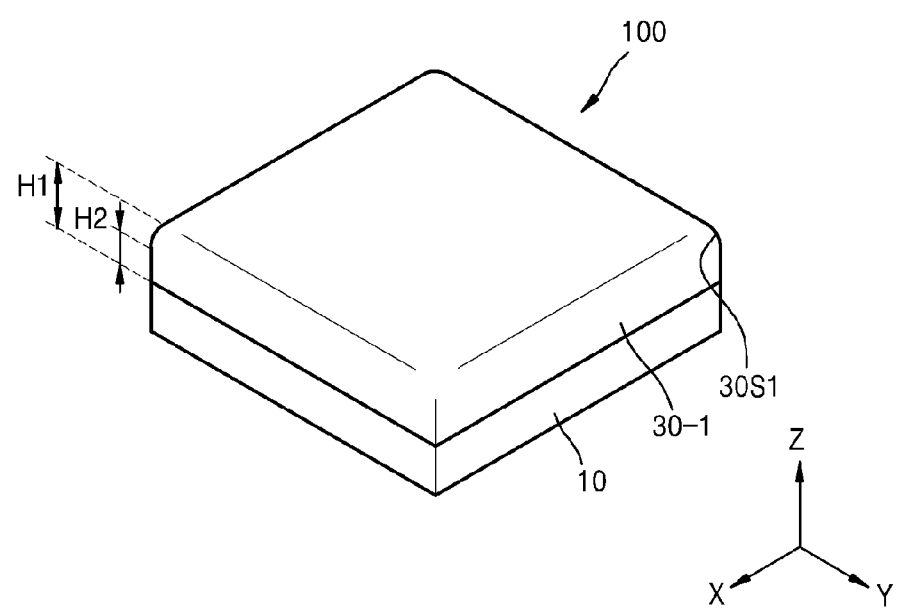

FIGS. 4A to 4C are perspective views illustrating the method of manufacturing the semiconductor package 100 shown in FIGS. 2A to 2G according to some embodiments. The perspective view of FIG. 4A may correspond to the cross-sectional view of FIG. 2C where FIG. 2C is a cross-section along line A. However, while the ends of the mold 50-1 are illustrated as being closed in FIG. 2C, here, the ends are illustrated as being open to aid in understanding the location of the various walls 50W1. A mold 50-1 may include multiple unit molding spaces 50U arranged in a matrix shape. A wall 50W1 of the mold 50-1, by which adjacent unit molding spaces 50U are separated from one another, may protrude from an inner top surface of the mold 50-1 and be spaced apart from the substrate 10. As described above with reference to FIG. 2C, the width of the wall 50W1 may be reduced downward from the inner top surface of the mold 50-1. Thus, the inner side surface of the mold 50-1 may have a continuous slope, for example, a round shape 50S1. Thus, since adjacent unit molding spaces 50U may communicate with one another, a molding material may be injected into one unit molding space 50U by injecting the molding material into another unit molding space 50U.

In the semiconductor package 100 shown in FIG. 4A, multiple walls 50W1 (i.e., a first wall 50W1-1 extending in a first direction (or x-direction of FIG. 4A) may have the same shape as a second wall 50W1-2 extending in a second direction (or y-direction of FIG. 4A)) that define one unit molding space 50U. That is, both the first wall 50W1-1 and the second wall 50W1-2 may protrude from the inner top surface of the mold 50-1 and be spaced apart from a top surface of the substrate 10. Also, an inner side surface of each of the first wall 50W1-1 and the second wall 50W1-2 may have the round shape 50S1.

However, other embodiments are not limited thereto, and a mold used in a method of manufacturing a semiconductor package according to an embodiment may include a first wall extending in the first direction and a second wall extending in the second direction to define one unit molding space 50U. The first wall and/or the second wall may be at least one selected from among walls 50W-1, 50W-2, 50W-3, 50W-4, 50W-5, and 50W-6 shown in the cross-sectional views of FIGS. 2C, 5A, 6A, 7B, 8A, and 9A. Thus, a wall having a slope may not be formed between adjacent unit molding spaces 50U.

Referring to FIG. 4B, after the mold 50-1 is removed, a molding material 30-1 may be formed to encapsulate semiconductor devices, namely, the memory and logic devices 20*a*1 and 20*b*1, formed on a substrate 10. The perspective view of FIG. 4B may correspond to the cross-sectional view of FIG. 2D where FIG. 2D is a cross-section along line B. A side surface of the molding material 30-1 may have a slope, for example, a round shape 30S1 from a first height H1 to a second height H2. Also, the side surface of the molding material 30-1 may connect multiple discrete semiconductor packages from a top surface of the substrate 10 to the second height H2.

The perspective view of FIG. 4C may correspond to the cross-sectional view of FIG. 2F. The substrate 10 of FIG. 4B and the molding material 30-1 configured to encapsulate multiple semiconductor devices, namely, the memory and logic devices 20*a*1 and 20*b*1, formed on the substrate 10 may be cut to separate the semiconductor devices, namely, the memory and logic devices 20*a*1 and 20*b*1. Thus, multiple discrete semiconductor packages, one of which is shown on FIG. 4C, may be formed.

Thereafter, an EMS layer 40-1 may be formed to cover an outer surface of the molding material 30-1 configured to encapsulate the semiconductor devices, namely, the memory and logic devices 20*a*1 and 20*b*1, disposed on the substrate 10 and a side surface of the substrate 10, thereby forming the semiconductor package 100 including the EMS layer 40-1. The side surface of the molding material 30-1 included in the semiconductor package 100 may have a slope (i.e., the round shape 30S1) so that the EMS layer 40-1 may be easily formed.

Although various examples above have described features of the mold 50-1 with respect to side surfaces of the molding material 30-1, similar features of the mold 50-1 may cause the corners of the semiconductor package 100 to have a sloped shape. For example, the corner of the semiconductor package 100 formed by two side surfaces and the top surface may have a sloped shape. In particular, the sloped shape in the corner may be a substantially continuous transition from a first one of the two side surfaces to a second of the two side surfaces. Accordingly, not only may the EMS layer 40-1 may be more easily formed at most to all transitions from the top surface to the side surfaces.

Figure 5A:
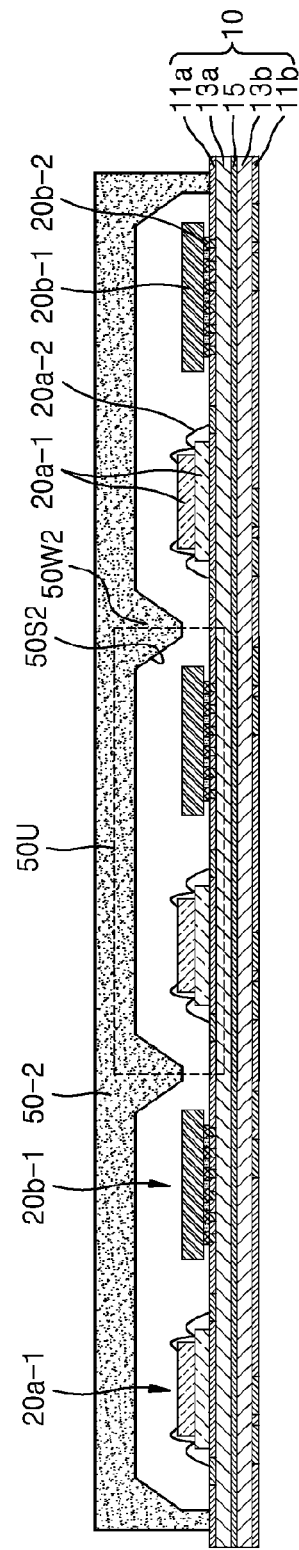
FIGS. 5A to 6B are cross-sectional views illustrating a method of manufacturing a semiconductor package, according to some embodiments.
Figure 5B:
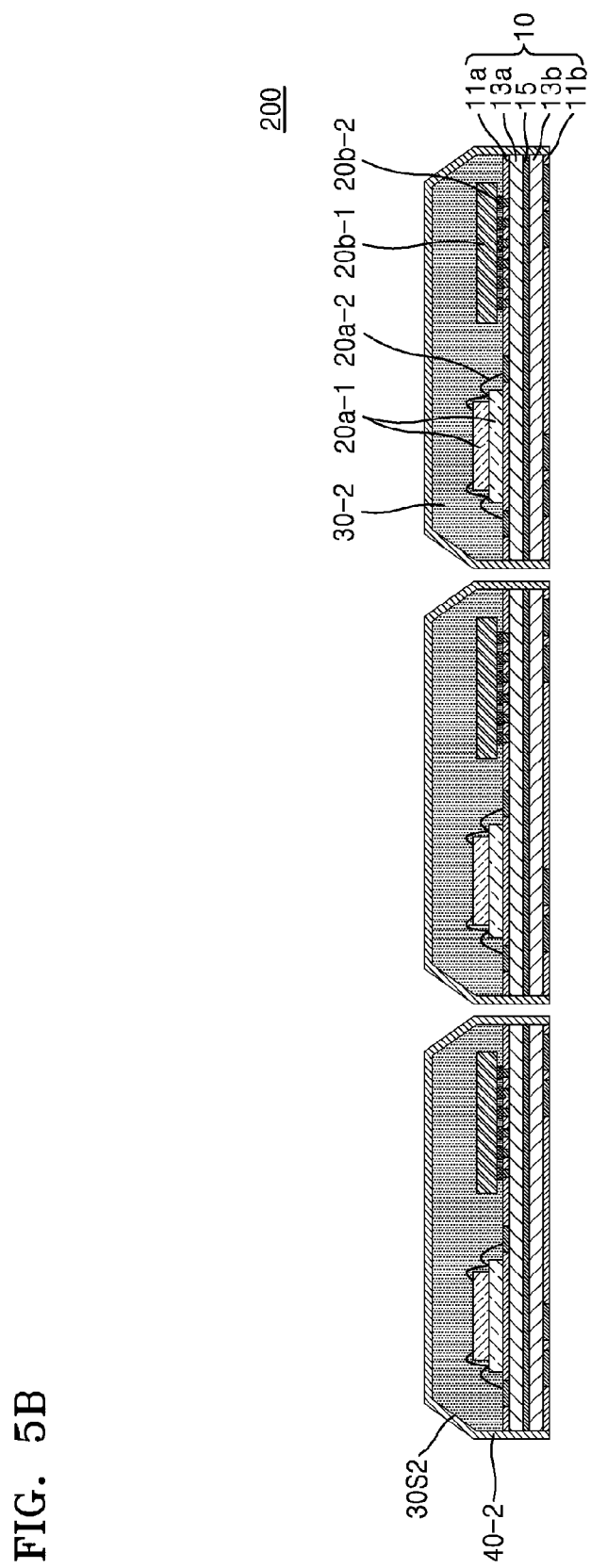

FIGS. 5A and 5B are cross-sectional views illustrating a method of manufacturing a semiconductor package 200, according to some embodiments. The method of manufacturing the semiconductor package 200 is similar to the method of manufacturing the semiconductor package 100 as described with reference to FIGS. 2A to 2G, except for a slope of an inner side surface of a mold 50-2 and different shapes of a molding material 30-2 and an EMS layer 40-2 that result from the slope.

Referring to FIG. 5A, the inner side surface of the mold 50-2 may have a predetermined slope 50S2, unlike the embodiment of FIG. 2B in which the inner side surface of the mold 50-1 has the round shape 50S1. That is, as a wall 50W2 between unit molding spaces 50U extends from an inner top surface of the mold 50-2 to the substrate 10, the width of the wall 50W2 may be reduced at a constant rate. That is, the inner side surface of the unit molding space 50U may have a predetermined slope 50S2. Similar to the embodiment of FIG. 2B, the wall 50W2 may be spaced apart from a top surface of the substrate 10.

Subsequent processes may be understood with reference to FIGS. 2C to 2F because the processes may be substantially the same as described with reference to FIGS. 2C to 2F. Specifically, the mold 50-2 may be disposed on the substrate 10, and a molding material 30-2 may be injected into a space defined by the substrate 10 and the mold 50-2 to encapsulate semiconductor devices, namely, the memory and logic devices 20*a*1 and 20*b*1. In this case, along the constant slope 50S2 of the inner side surface of the mold 50-1, the molding material 30-2 may include a surface, which has a constant slope 30S2 from a first height H1 to a second height H2, between a top surface and a side surface of the molding material 30-2. The walls 50W2 may be spaced apart from the substrate 10. Thus, adjacent unit molding spaces 50U may communicate with one another, and a molding material may be injected into one unit molding space 50U by injecting the molding material into another unit molding space 50U. Thereafter, the mold 50-2 may be removed from the substrate 10, and the substrate 10 and the molding material 30-2 may be cut to separate the semiconductor devices, namely, the memory and logic devices 20a1 and 20b1, into discrete semiconductor packages.

Referring to FIG. 5B, the EMS layer 40-2 may be formed to cover top and side surfaces of the discrete semiconductor packages, thereby completing the manufacture of the semiconductor package 200. The EMS layer 40-2 formed on the side surface of the molding material 30-2 may have a constant slope along a shape of the molding material 30-2.

Figure 6A:
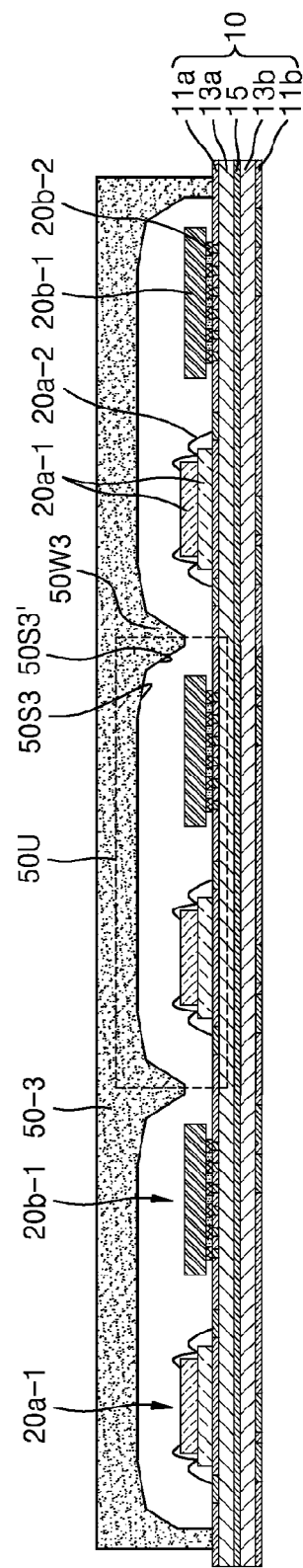
Figure 6B:
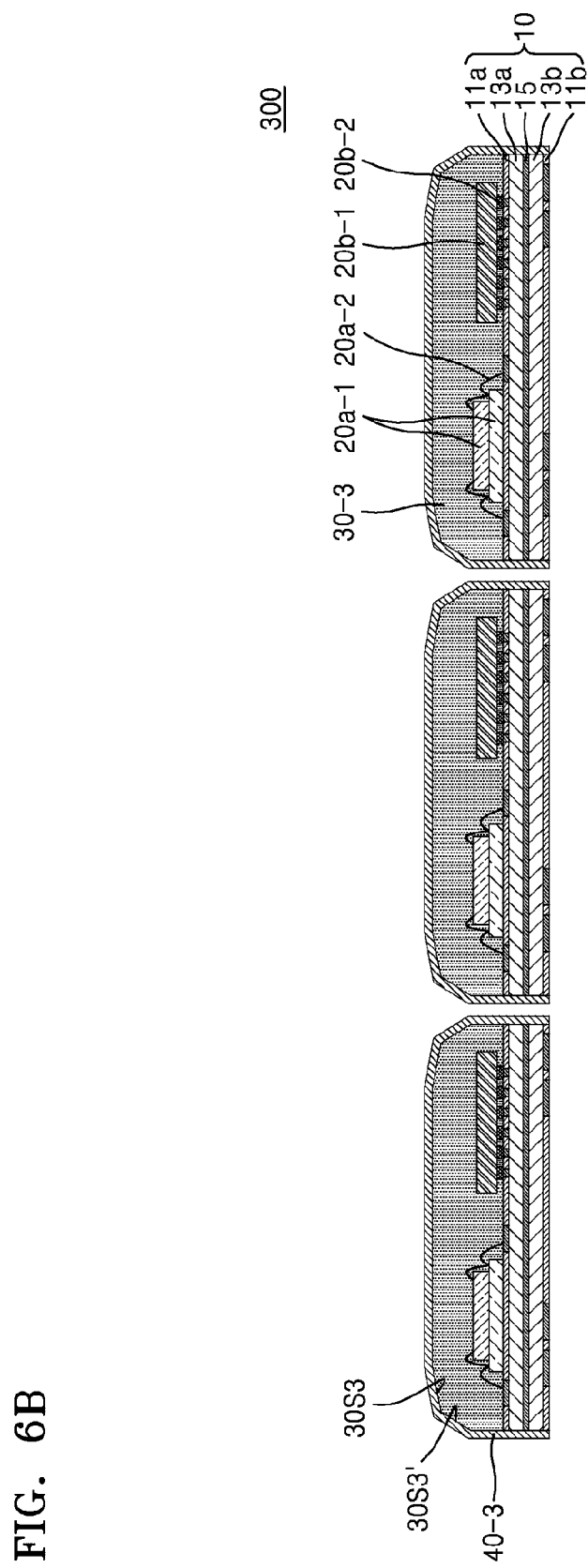

FIGS. 6A and 6B are cross-sectional views illustrating a method of manufacturing a semiconductor package 300, according to some embodiments. The method of manufacturing the semiconductor package 300 is similar to the method of manufacturing the semiconductor package 100, as shown in FIGS. 2A to 2G, except for a slope of an inner side surface of a mold 50-3 and different shapes of a molding material 30-3 and an EMS layer 40-3 that result from the slope.

Referring to FIG. 6A, the mold 50-3 of which the inner side surface has two slopes 50S3 and 50S3' may be used instead of the mold 50-1 of which the inner side surface has the round shape 50S1, as shown in FIG. 2B. Similar to the process of FIG. 2B, the wall 50W3 may be spaced apart from a top surface of the substrate 10. Subsequent processes may be understood with reference to FIGS. 2C to 2F because the subsequent processes are substantially the same as described with reference to FIGS. 2C to 2F. That is, an operation of injecting a molding material, an operation of removing a mold, an operation of separating the substrate 10 into discrete semiconductor packages, and an operation of forming an EMS layer may be performed. In this case, along a shape of the mold 50-3, a side surface of the molding material 30-3 may include surfaces having two different slopes 30S3 and 30S3' from a first height H1 to a second height H2.

Referring to FIG. 6B, an EMS layer 40-3 may be formed to cover top surfaces and side surfaces of the discrete semiconductor packages, thereby completing the manufacture of the semiconductor package 300.

Although FIG. 6A illustrates an example in which the inner side surface of the mold 50-3 has the two slopes 50S3 and 50S3', other embodiments are not limited thereto. In some embodiments, the inner side surface of the mold 50-3 may have at least one slope, for example, three, four, or more slopes.

FIGS. 7A to 7F are cross-sectional views illustrating a method of manufacturing a semiconductor package 400, according to some embodiments. The method shown in FIGS. 7A to 7F is similar to the method of manufacturing the semiconductor package 100 as shown in FIGS. 2A to 2G, except that a wall protruding from a top surface of a mold 50-4 extends to contact a substrate 10 and a molding material 30-4 and an EMS layer 40-4 are formed in different shapes.

Figure 7A:
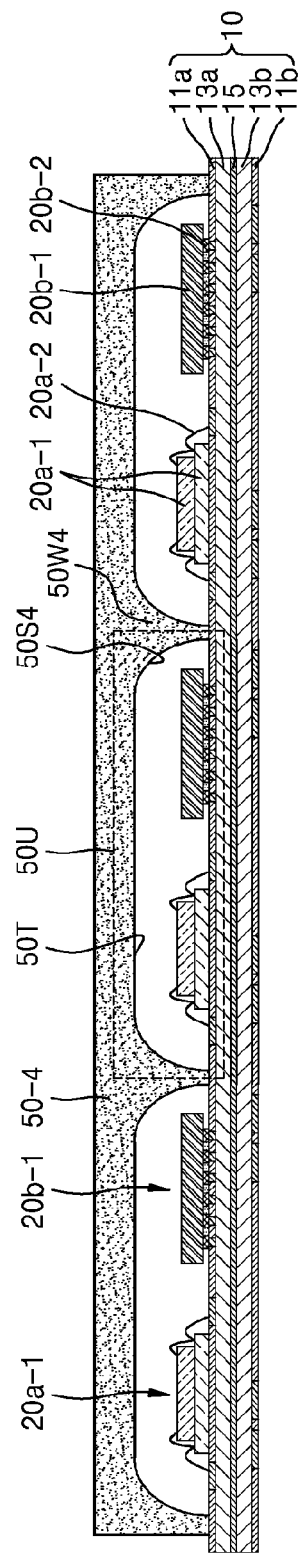

Referring to FIG. 7A, the mold 50-4 may be disposed on the substrate 10 to define semiconductor devices, namely, the memory and logic devices 20a1 and 20b1, disposed on the substrate 10 in the mold 50-4. The mold 50-4 may include multiple walls 50W4 protruding an inner top surface 50T of the mold 50-4 to separate unit molding spaces 50U. Also, the width of the walls 50W4 may be reduced downward. In this case, the walls 50W4 may extend to a top surface of the substrate 10. That is, an inner side surface of the unit molding space 50U may have at least one slope, for example, a round shape 50S4. That is, a side surface of each of the walls 50W4 may have a round shape 50S4 from the inner top surface 50T of the mold 50-4 to the top surface of the substrate 10. However, in other embodiments, the round shape 50S4 of the wall 50W4 may not extend to the top surface of the substrate 10. That is, at some point before contacting the substrate 10, the wall 50W4 may transition to have a vertical wall surface.

Figure 7B:
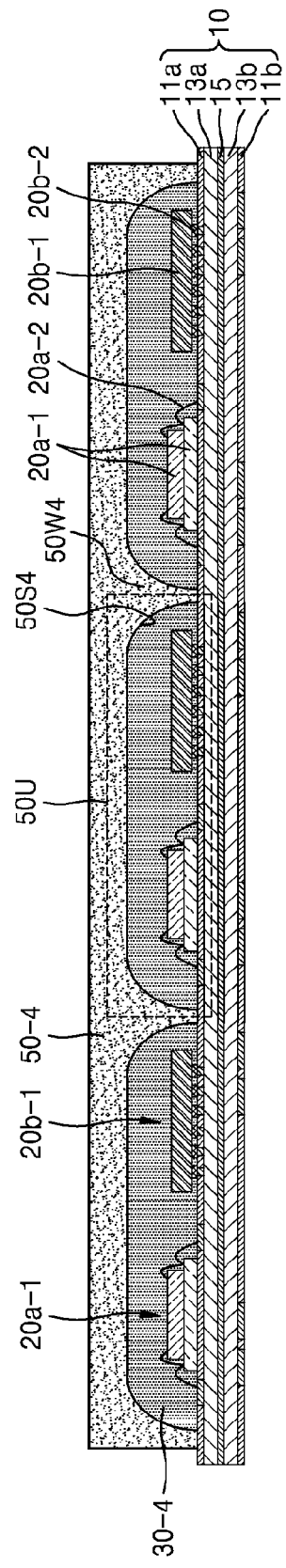

Referring to FIG. 7B, a molding material 30-4 may be injected into the unit molding spaces 50U, which are defined by the substrate 10 and the mold 50-4, to encapsulate the semiconductor devices, namely, the memory and logic devices 20a1 and 20b1. Since the walls 50W4 between the unit molding spaces 50U extend to the top surface of the substrate 10 and have round shapes 50S4, a side surface of the molding material 50-4 may have a slope over a relatively wide range.

Referring to FIG. 7C, the mold 50-4 may be removed from the substrate 10. The molding material 30-4 may be disposed on the substrate 10 to encapsulate the semiconductor devices, namely, the memory and logic devices 20a1 and 20b1. Since the walls 50W4 shown in FIGS. 7A and 7B extend to the top surface of the substrate 10 from boundary lines by which the semiconductor devices, namely, the memory and logic devices 20a1 and 20b1, are separated, the molding material 30-4 may not be formed at the boundary lines so that multiple grooves h' may be formed to expose the top surface of the substrate 10.

Figure 7D:
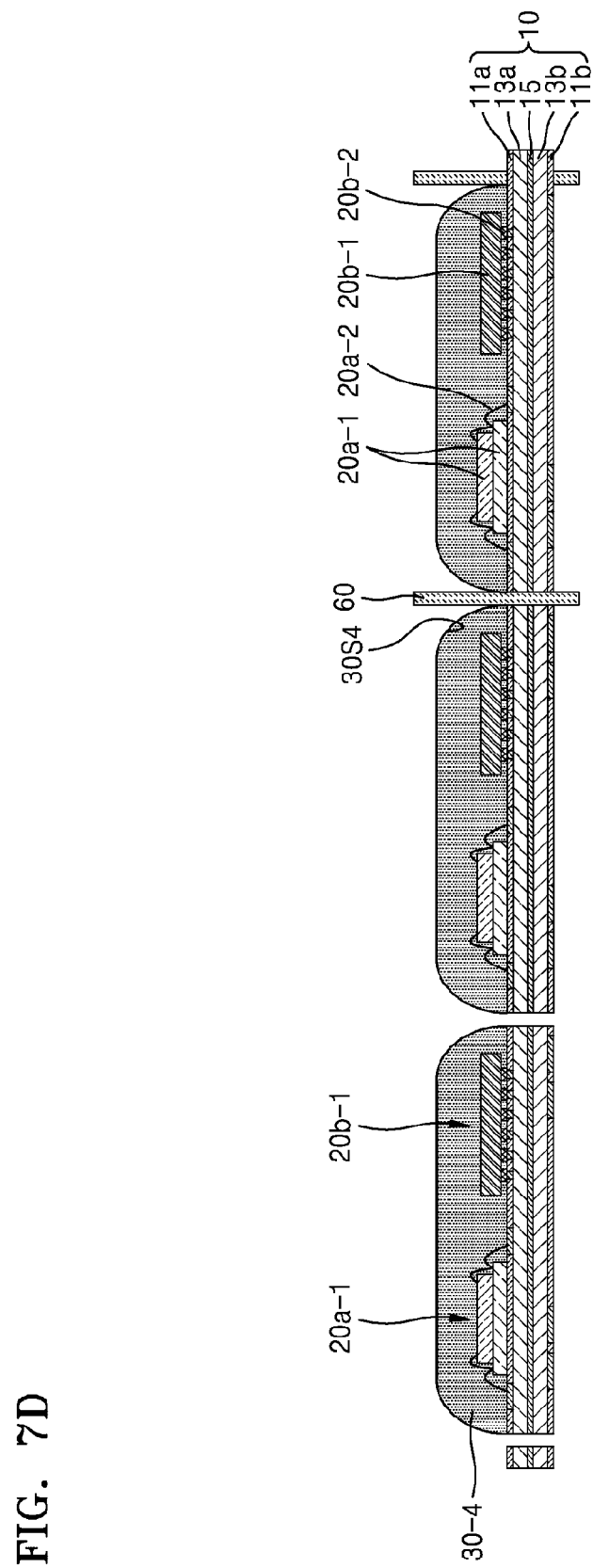

Referring to FIG. 7D, the semiconductor devices, namely, the memory and logic devices 20a1 and 20b1, encapsulated by the molding material 30-4 may be cut using a cutter, for example, a blade 60, and separated into discrete semiconductor packages. In this case, the grooves h' may be formed at the boundary lines by which the discrete semiconductor packages are separated, so that the molding material 30-4 may not be formed on the substrate 10. Thus, since it is only necessary to cut the substrate 10 during the process of separating the semiconductor devices, namely, the memory and logic devices 20a1 and 20b1, into discrete semiconductor packages, the separation process may be more easily performed as compared with a package having both a molding material and a substrate to be cut.

Figure 7E:
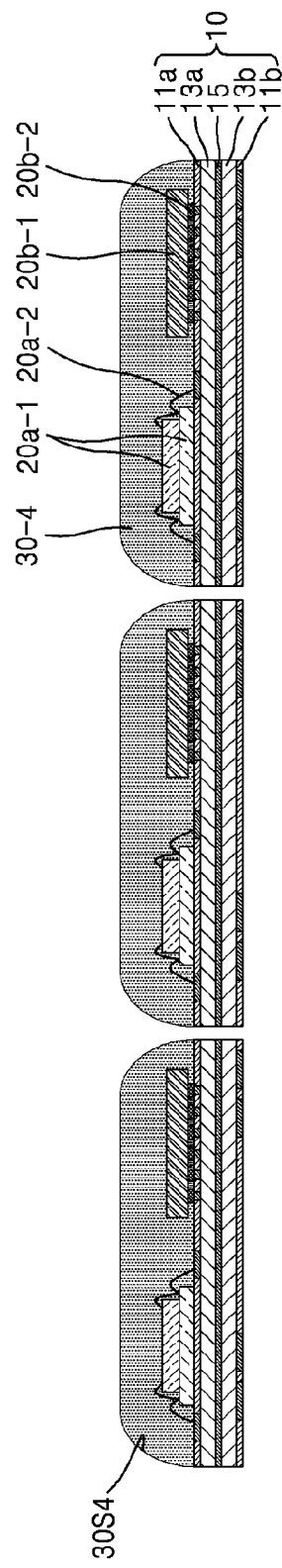

FIG. 7E illustrates a state in which the semiconductor devices, namely, the memory and logic devices 20a1 and 20b1, are separated into discrete semiconductor packages. A side surface of each of the discrete semiconductor packages may have a continuous slope (i.e., a round shape 30S4) from a top surface of the molding material 30-4 to the top surface of the substrate 10.

Figure 7F:
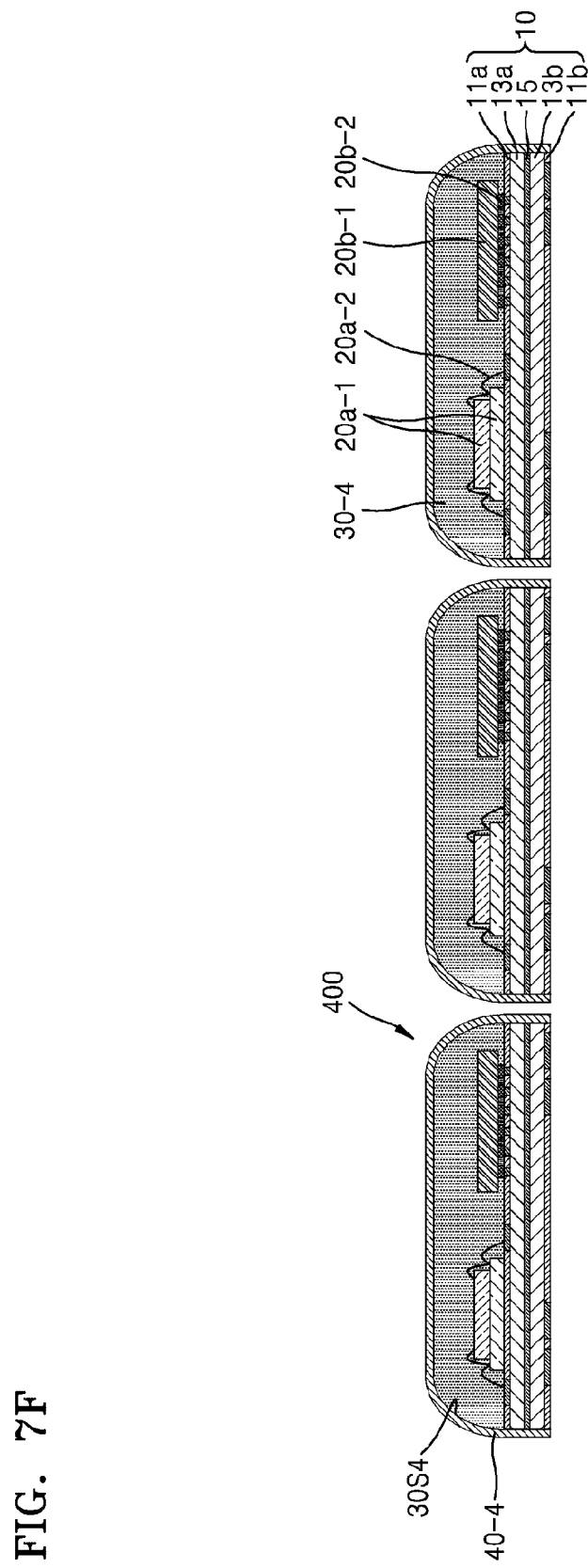

Referring to FIG. 7F, an EMS layer 40-4 may be formed to cover top and side surfaces of the discrete semiconductor packages, thereby completing the manufacture of the semiconductor package 400. The EMS layer 40-4 formed on the side surface of the molding material 30-4 may have a slope (i.e., a round shape) along a shape of the molding material 30-4.

Figure 8A:
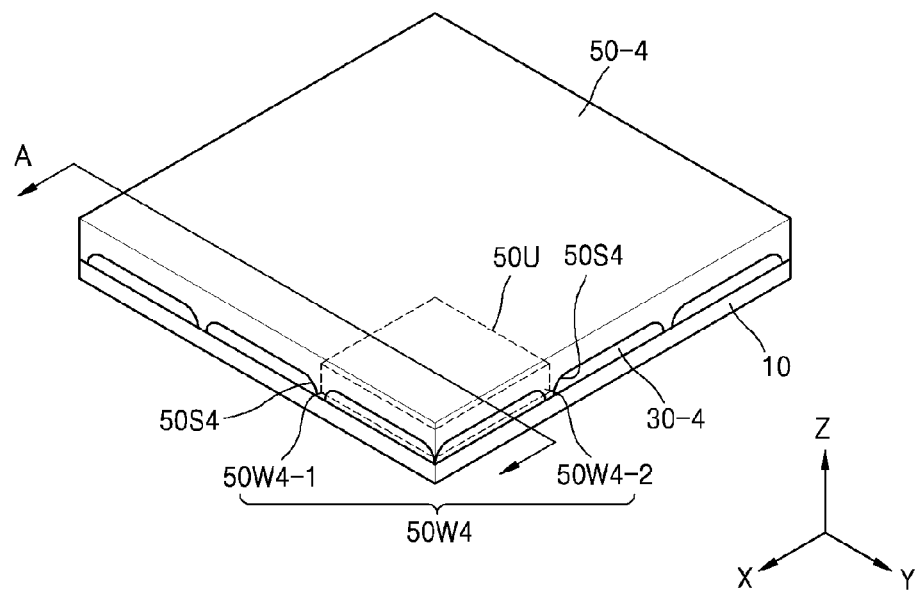
FIGS. 8A to 8C are perspective views illustrating a method of manufacturing a semiconductor package, according to some embodiments.
Figure 8B:
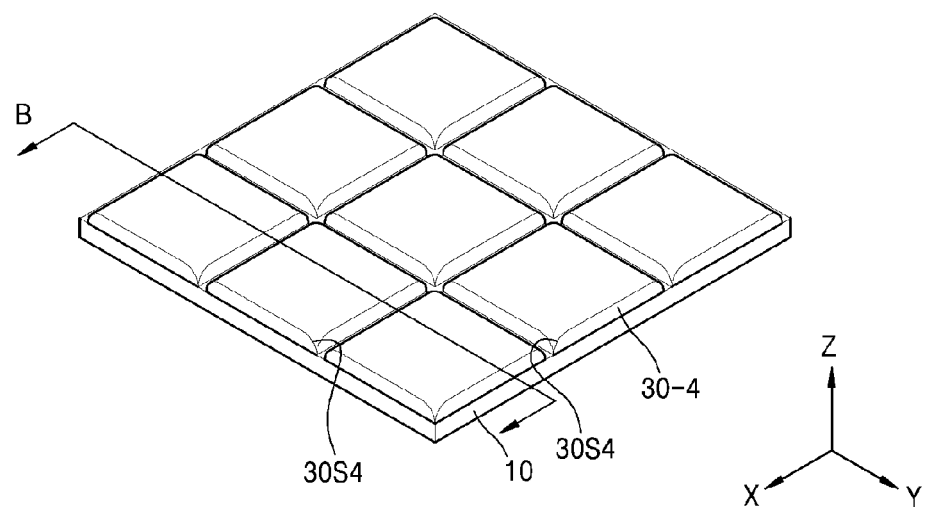
Figure 8C:
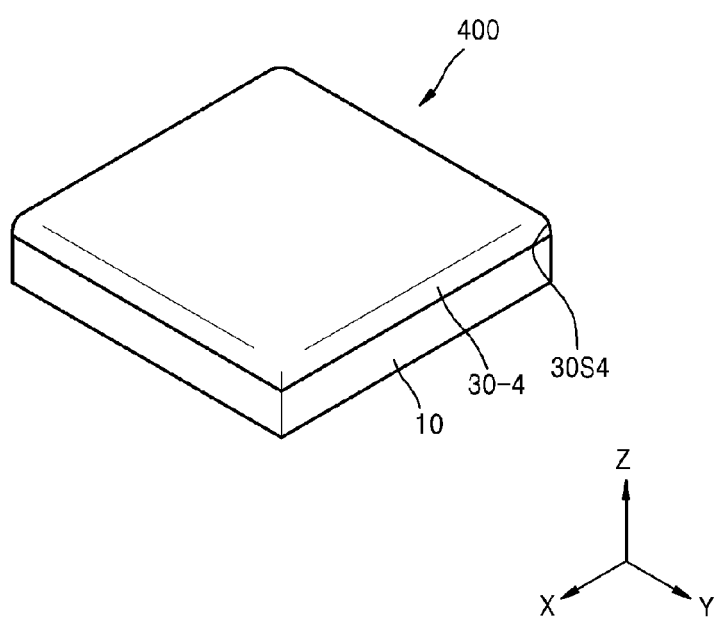

FIGS. 8A to 8C are perspective views illustrating the method of manufacturing the semiconductor package 400 as shown in FIGS. 7A to 7C. The perspective view of FIG. 8A may correspond to the cross-sectional view of FIG. 7B where FIG. 7B is a cross-section along line A. The mold 50-4 may include multiple unit molding spaces arranged in a matrix shape. A wall 50W4 of the mold 50-4, by which adjacent unit molding spaces 50U may be separated, may protrude from an inner top surface of the mold 50-4 and extend to contact a top surface of the substrate 10. A width of the wall 50W4 may be reduced downward from the inner top surface of the mold 50-4. Thus, the inner side surface of the mold 50-4 may have a continuous slope, for example, a round shape 50S4.

Referring to FIG. 8A, in the semiconductor package 400, multiple walls 50W4 configured to define one unit molding space 50U, namely, a first wall 50W4-1 extending in a first direction (x-direction of FIG. 8A) may have the same shape as a second wall 50W4-2 extending in a second direction (y-direction of FIG. 8A). That is, each of the first wall 50W4-1 and the second wall 50W4-2 may protrude from the inner top surface of the mold 50-4 and extend to contact the top surface of the substrate 10. Also, an inner side surface of each of the first wall 50W4-1 and the second wall 50W4-2 may have a round shape 50S4.

However, other embodiments are not limited thereto. As described above, each of the first wall 50W4-1 and/or the second wall 50W4-2 may be selected from among the walls 50W-1, 50W-2, 50W-3, 50W-4, 50W-5, and 50W-6 shown in the cross-sectional views of FIGS. 2C, 5A, 6A, 7B, 8A, and 9A. In some embodiments, any one of the first wall 50W4-1 and the second wall 50W4-2 may be a wall that does not have a slope. Also, any one of the first wall 50W4-1 and the second wall 50W4-2 may be omitted.

Referring to FIG. 8B, after the mold 50-4 is removed, a molding material 30-4 may be formed on the substrate 10 to encapsulate semiconductor devices, namely, the memory and logic devices 20a1 and 20b1. The perspective view of FIG. 8B may correspond to the cross-sectional view of FIG. 7C where FIG. 7C is a cross-section along line B. In the molding material 30-4 included in a discrete semiconductor package, both a surface perpendicular to a first direction (x-direction of FIG. 8B) and a surface perpendicular to a second direction (y-direction of FIG. 8B) may have a round shape 30S4. Molding materials 30-4 included in the discrete semiconductor packages may be separated from one another.

The perspective view of FIG. 8C may correspond to the cross-sectional view of FIG. 7E. The substrate 10 may be cut into the discrete semiconductor packages of FIG. 8B, thereby forming the discrete semiconductor packages of FIG. 7E.

Thereafter, the EMS layer 40-4 of FIG. 7F may be formed to cover outer surfaces of the discrete semiconductor packages, thereby forming a semiconductor package 400 including the EMS layer 40-4.

Figure 9A:
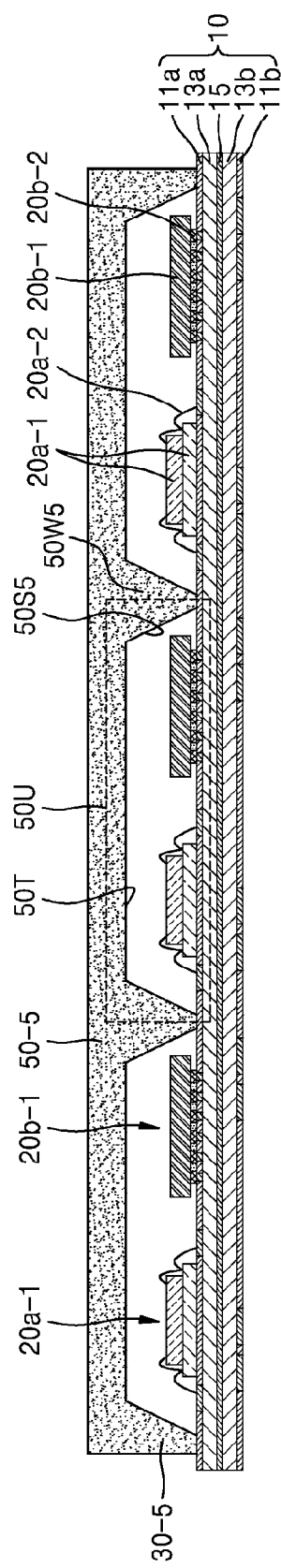
FIGS. 9A to 10B are cross-sectional views illustrating a method of manufacturing a semiconductor package, according to some embodiments.
Figure 9B:
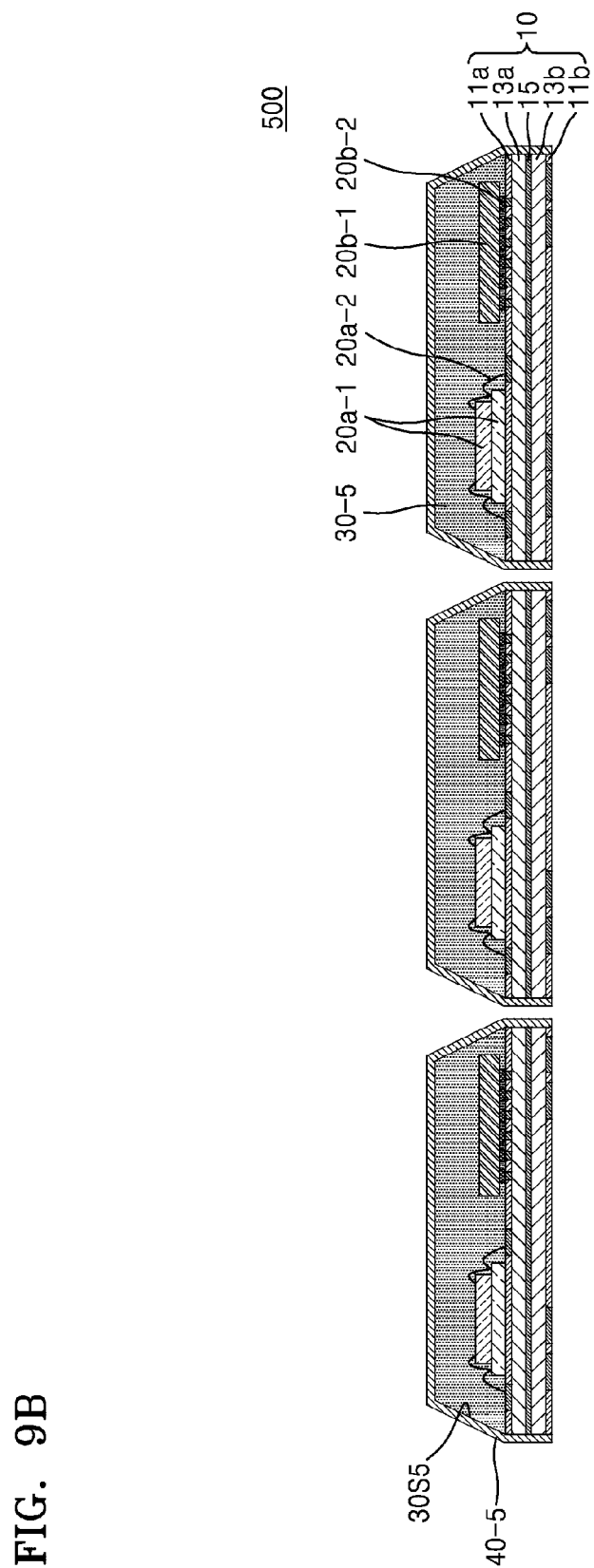

FIGS. 9A and 9B are cross-sectional views illustrating a method of manufacturing a semiconductor package 500, according to some embodiments. The method shown in FIGS. 9A and 9B is similar to the method of manufacturing the semiconductor package 400 as shown in FIGS. 7A to 7F, except for a slope of an inner side surface of a mold 50-5 and different shapes of a molding material 30-5 and an EMS layer 40-5 due to the slope of the inner side surface of the mold 50-5.

Referring to FIG. 9A, a mold 50-5 of which an inner side surface has a constant slope 50S5 may be used instead of the mold 50-4 of which the inner side surface has the round shape 50S4 of FIG. 7A. That is, as a wall 50W5 of a unit molding space 50U extends from an inner top surface 50T of the mold 50-5 to the substrate 10, the width of the wall SOWS may be reduced at a constant rate. That is, an inner side surface of the unit molding space 50U may have a constant slope 50S5. Similar to the embodiment shown in FIG. 7A, the wall 50W5 may be in contact with a top surface of the substrate 10.

Subsequent processes may be understood with reference to FIGS. 7C to 7F because the subsequent processes are substantially the same as described with reference to FIGS. 7C to 7F. That is, an operation of injecting a molding material, an operation of removing a mold, an operation of separating the substrate 10 into discrete semiconductor packages, and an operation of forming an EMS layer may be performed. In this case, a side surface of the molding material 30-5 may include a surface having a constant slope 30S5 from a top surface of the molding material 30-5 to the top surface of the substrate 10.

Referring to FIG. 9B, the EMS layer 40-5 may be formed to cover a top surface and side surfaces of a discrete semiconductor package, thereby completing the manufacture of the semiconductor package 500. The side surface of the molding material 30-5 and a side surface of the EMS layer 40-5 may have two side surfaces along the shape of the mold 50-5.

Figure 10A:
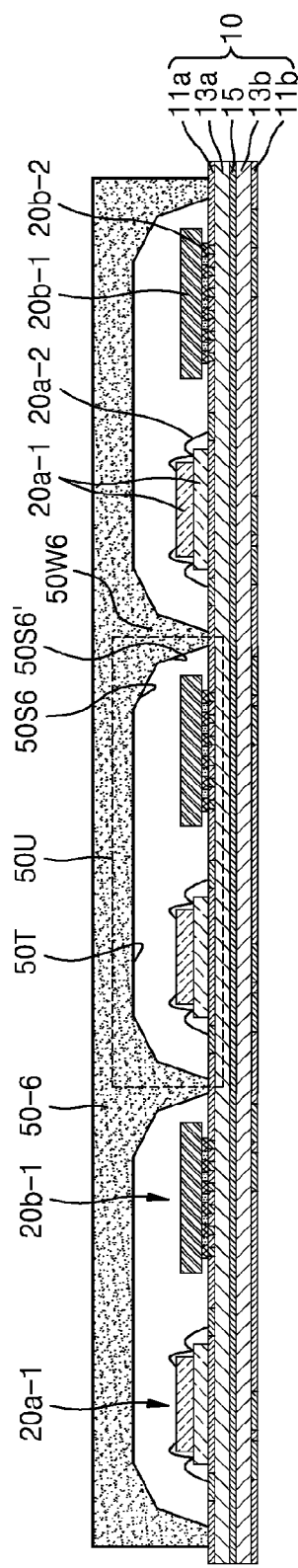
Figure 10B:
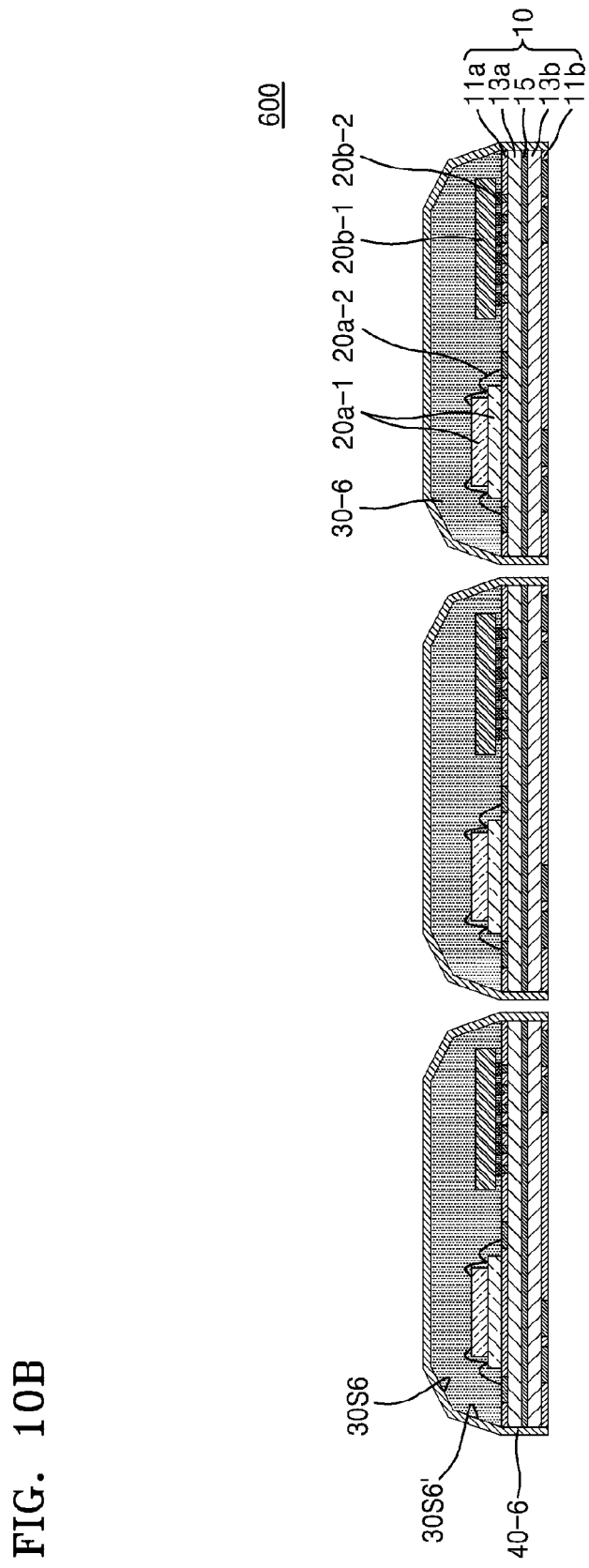

FIGS. 10A and 10B are cross-sectional views illustrating a method of manufacturing a semiconductor package 600, according to some embodiments. The method shown in FIGS. 10A and 10B is similar to the method of manufacturing the semiconductor package 400 as shown in FIGS. 7A to 7F, except for a slope of an inner side surface of a mold 50-6 and different shapes of a molding material 30-6 and an EMS layer 40-6 due to the slope of the inner side surface of the mold 50-6.

Referring to FIG. 10A, a mold 50-6 of which an inner side surface has two slopes 50S6 and 50S6' may be used instead of the mold 50-6 of which the inner side surface has the round shape 50S4, as shown in FIG. 7A. Similar to the embodiment shown in FIG. 7A, a wall 50W6 may be contact a top surface of a substrate 10. Since subsequent processes are substantially the same as described with reference to FIGS. 7C to 7F, the subsequent processes will be understood with reference to FIGS. 7C to 7F. A side surface of the molding material 30-6 may include a surface having two different slopes 30S6 and 30S6' from a top surface of the molding material 30-6 to the top surface of the substrate 10.

Referring to FIG. 10B, an EMS layer 40-6 may be formed to cover a top surface and side surfaces of a discrete semiconductor package, thereby completing the manufacture of a semiconductor package 600. A side surface of the molding material 30-6 and a side surface of the EM layer 40-6 may have two slopes along a shape of the mold 50-6.

FIGS. 11A to 11D are perspective views illustrating a method of manufacturing a semiconductor package 700, according to some embodiments. The method shown in FIGS. 11A to 11D is similar to the method of manufacturing the semiconductor package 400, as shown in FIGS. 8A to 8C, except that a mold 50-7 includes only a first wall 50W4-1 formed in a first direction (x-direction of FIG. 11A), and no wall is formed in a second direction (y-direction of FIG. 11A).

Figure 11A:
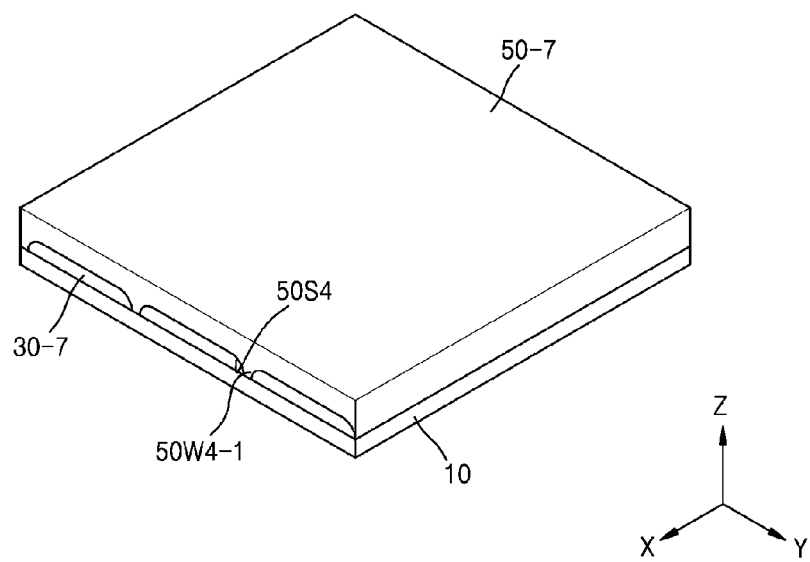
FIG. 11A to FIG. 12D are perspective views illustrating methods of manufacturing semiconductor packages, according to some embodiments.

Referring to FIG. 11A, the mold 50-7 may include a first wall 50W4-1 that extends in a first direction (x-direction of FIG. 11A). The first wall 50W4-1 may extend to protrude from an inner top surface of the mold 50-7 and contact a top surface of the substrate 10. Also, an inner side surface of the first wall 50W4-1 may have a round shape 50S4. Since the mold 50-7 does not include a wall crossing the first wall 50W4-1, a molding material 30-7 may be more easily injected into the mold 50-7.

In some embodiments, the first wall 50W4-1 may be any one of the walls 50W-1, 50W-2, 50W-3, 50W-4, 50W-5, and 50W-6 shown in the cross-sectional views of FIGS. 2C, 5A, 6A, 7B, 8A, and 9A.

Figure 11B:
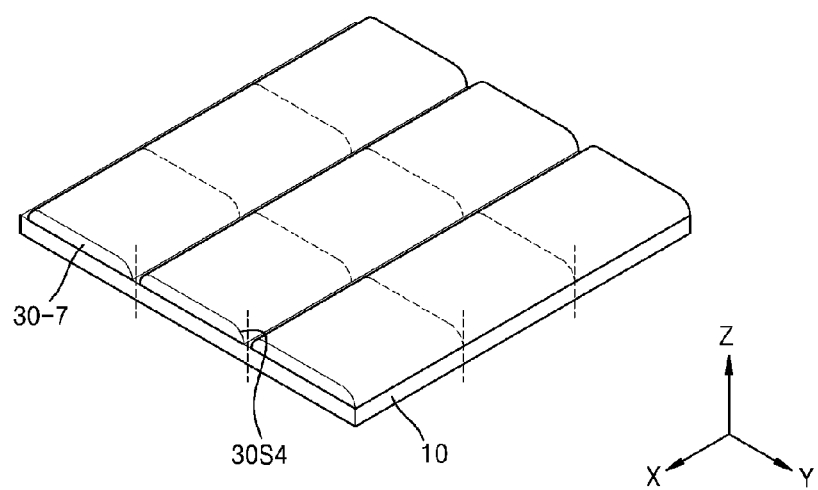

Referring to FIG. 11B, after the mold 50-7 is removed, the molding material 30-7 may be formed on the substrate 10 to encapsulate semiconductor devices, namely, the memory and logic devices 20a1 and 20b1. The molding material 30-7 may be separated in a first direction (y-direction of FIG. 11B), but connected in a second direction (y-direction of FIG. 11B).

Figure 11C:
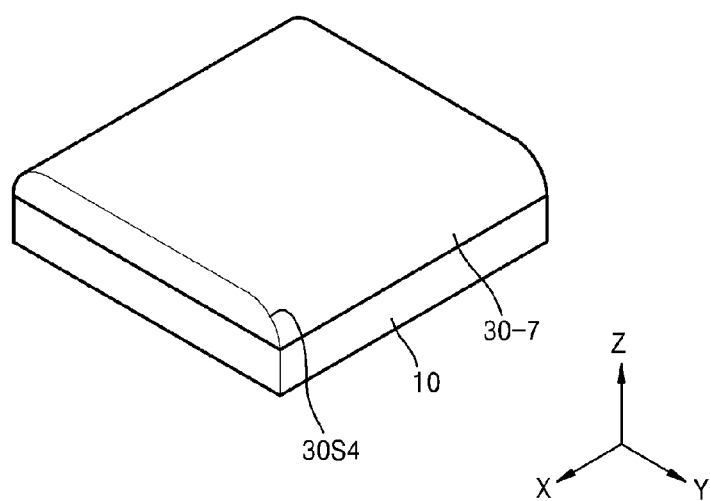

Referring to FIG. 11C, the substrate 10 may be cut in the first direction such that multiple discrete semiconductor packages of FIG. 11B are separated from one another. The substrate 10 and the molding material 30-7 may be cut in the second direction, thereby forming a discrete semiconductor package.

Figure 11D:
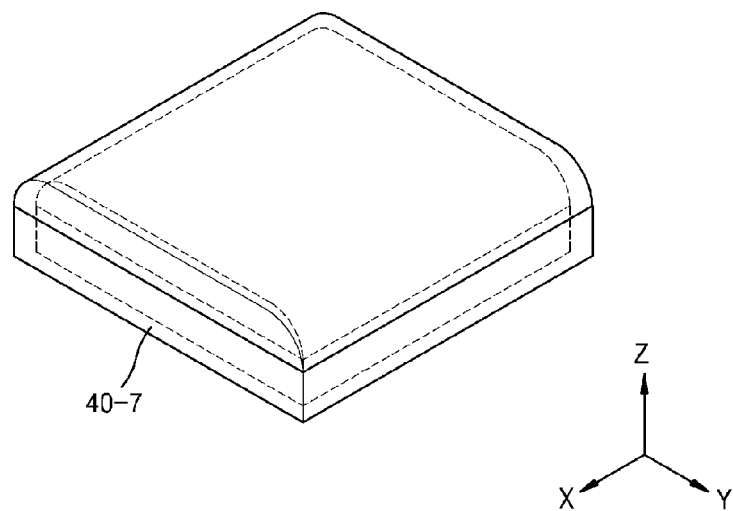

Referring to FIG. 11D, an EMS layer 40-7 may be formed to cover an outer surface of the discrete semiconductor package, thereby forming a semiconductor package 700 including the EMS layer 40-7.

Figure 12A:
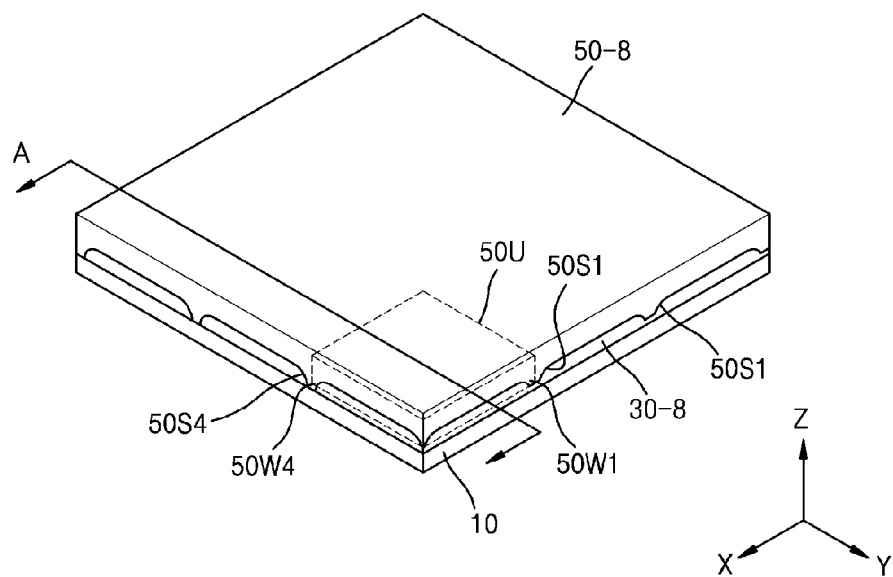
Figure 12B:
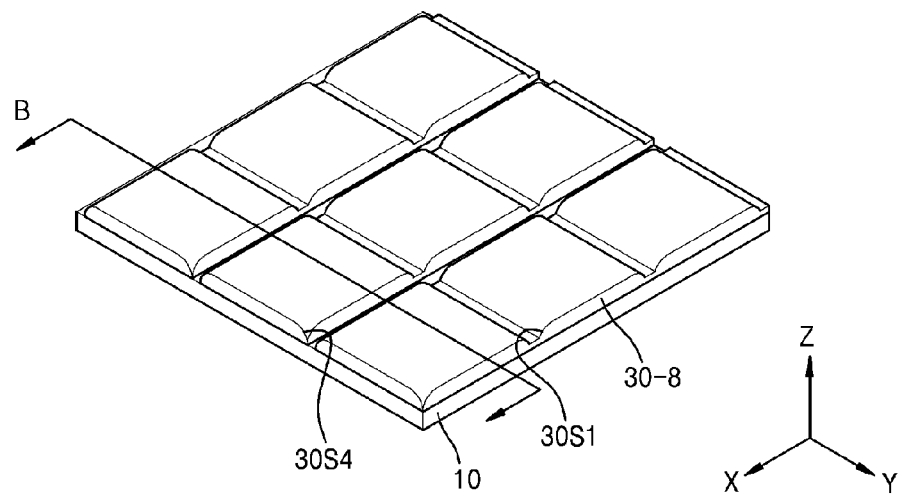

FIGS. 12A and 12B are perspective views illustrating a method of manufacturing a semiconductor package 800, according to some embodiments. The method shown in FIGS. 12A and 12B is similar to the method of manufacturing the semiconductor package 400 as shown in FIGS. 8A to 8C, except that a first wall 50W4 of a mold 50-8, which is disposed along a first direction (x-direction of FIG. 12A), extends to a top surface of a substrate 10, and a second wall 50W1 of the mold 50-8, which is disposed along a second direction (y-direction of FIG. 12A), is spaced apart from the top surface of the substrate 10.

Referring to FIG. 12A, the first wall 50W4 formed in the first direction (x-direction of FIG. 12A) may extend to the top surface of the substrate 10, as shown in FIGS. 7A and 8A, and an inner side surface of the first wall 50W4 may have a round shape 50S4. The second wall 50W1 formed in the second direction (y-direction of FIG. 12A) may be spaced apart from the top surface of the substrate 10, as shown in FIGS. 2B and 4A, and an inner side surface of the second wall 50W1 may have a round shape 50S 1. Since the second wall 50W1 of the mold 50-8 is spaced apart from the top surface of the substrate 10 and unit molding spaces 50U communicate with one another, a molding material 30-8 may be more easily formed in the mold 50-8.

In some embodiments, the first wall 50W4 and/or the second wall 50W1 may be selected from among the walls 50W-1, 50W-2, 50W-3, 50W-4, 50W-5, and 50W-6 shown in the cross-sectional views of FIGS. 2C, 5A, 6A, 7B, 8A, and 9A.

Referring to FIG. 12B, after the mold 50-8 is removed, the molding material 30-8 may be formed on the substrate 10 to encapsulate semiconductor devices, namely, the memory and logic devices 20a1 and 20b1. The molding material 30-8 included in a discrete semiconductor package may be separated into portions in the second direction, but lower portions of the molding material 30-8 may be connected to one another in the first direction.

Figure 12C:
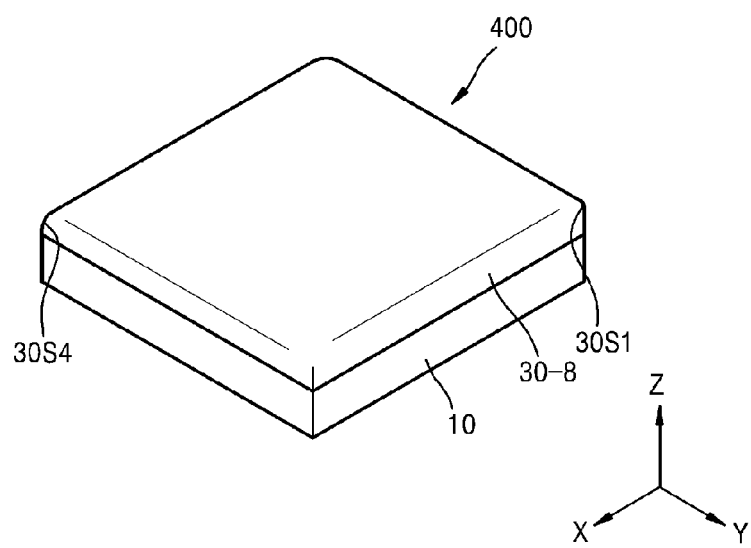

Referring to FIG. 12C, the substrate 10 may be cut in the first direction so that multiple discrete semiconductor packages may be separated from one another. The substrate 10 and the molding material 30-8 may be cut in the second direction, thereby forming discrete semiconductor packages.

Figure 12D:
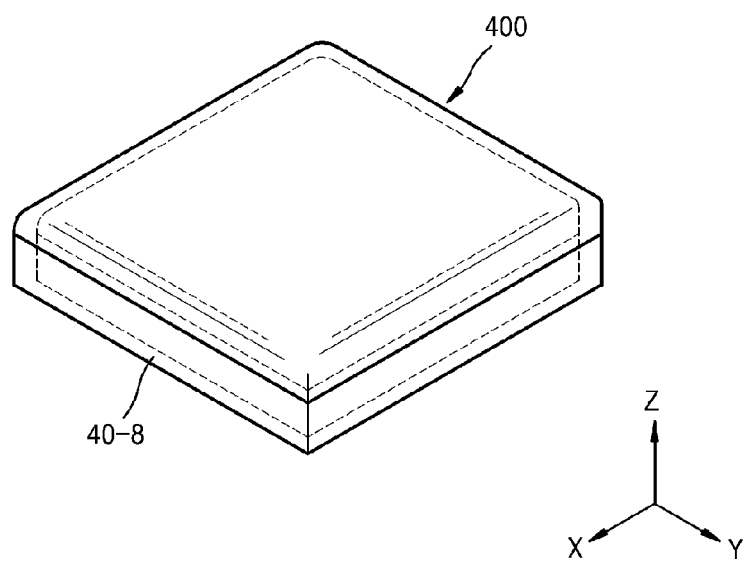

Referring to FIG. 12D, an EMS layer 40-8 may be formed to cover outer surfaces of the discrete semiconductor packages, thereby forming the semiconductor package 800 including the EMS layer 40-8.

Figure 13:
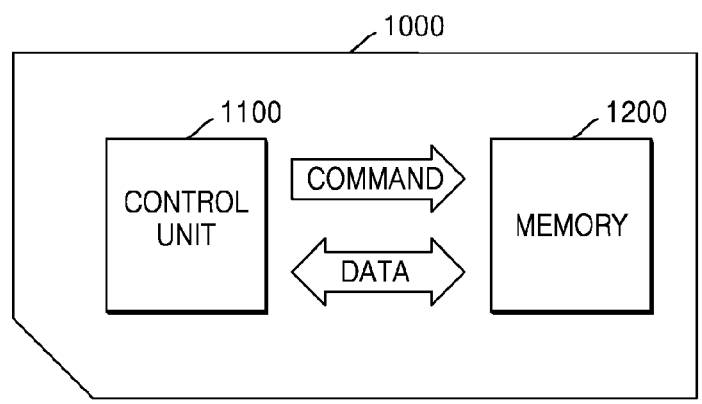
FIG. 13 is a schematic block diagram of a memory card including a semiconductor package according to some embodiments.

FIG. 13 is a schematic block diagram of a memory card 1000 including a semiconductor package according to some embodiments. Referring to FIG. 13, a control unit 1100 and a memory 1200 may be disposed in the memory card 1000 and exchange electric signals with each other. For example, when the control unit 1100 generates a command and outputs the command to the memory 1200, the memory 1200 may transmit data to the control unit 1100. The control unit 1100 may include at least one of the semiconductor packages 100, 200, 300, 400, 500, 600, 700, and 800 shown in FIGS. 1A to 12D and other semiconductor packages formed by using a method of manufacturing a semiconductor package, according to embodiments. Also, the control unit 1100 and the memory 1200 may include at least one of the semiconductor packages 100, 200, 300, 400, 500, 600, 700, and 800 shown in FIGS. 1A to 12D and other semiconductor packages formed by using a method of manufacturing a semiconductor package, according to various embodiments. The memory 1200 may include a memory array (not shown) or a memory array bank (not shown).

The memory card 1000 may be included in memory devices, for example, various kinds of cards, such as a memory stick card, a smart media (SM) card, a secure digital (SD) card, a mini-SD card, or a multimedia card (MMC).

Figure 14:
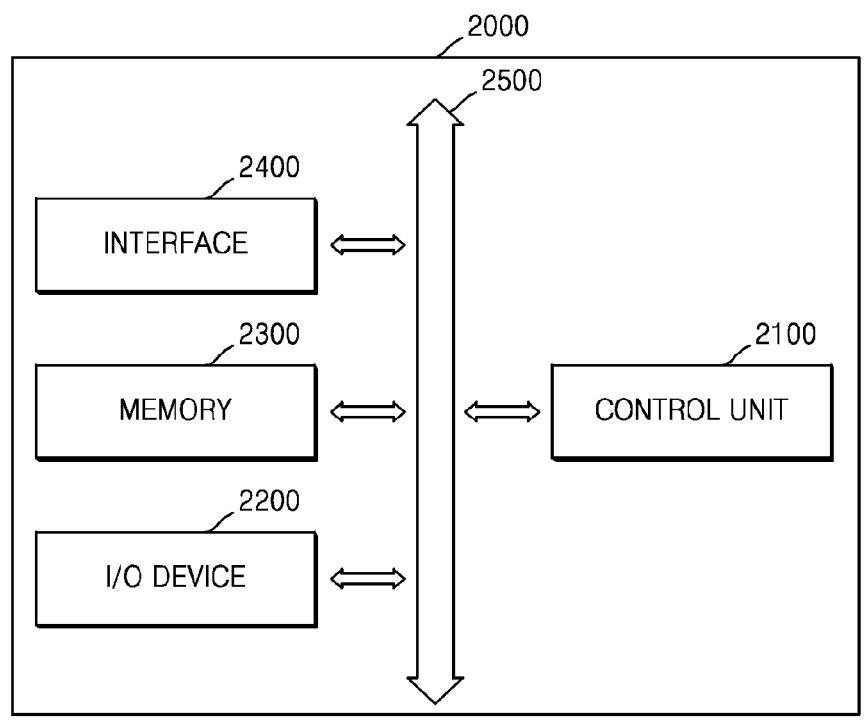
FIG. 14 is a schematic block diagram of an electronic system including a semiconductor package according to some embodiments.

FIG. 14 is a schematic block diagram of an electronic system 2000 including a semiconductor package according to some embodiments. Referring to FIG. 14, the electronic system 2000 may include a control unit 2100, an input/output (I/O) device 2200, a memory 2300, and an interface 2400. The electronic system 2000 may be a mobile system or a system configured to transmit or receive information. The mobile system may be a personal digital assistant (PDA), a portable computer, a web tablet, a wireless phone, a mobile phone, a digital music player, or a memory card.

The control unit 2100 may execute a program and control the electronic system 2000. The control unit 2100 may include at least one of the semiconductor packages 100, 200, 300, 400, 500, 600, 700, and 800 shown in FIGS. 1A to 12D and other semiconductor packages formed by using a method of manufacturing a semiconductor package, according to various embodiments. Thus, the control unit 2100 may be, for example, a microprocessor (MP), a digital signal processor (DSP), a microcontroller (MC), or a device similar thereto. The I/O device 2200 may be used to input or output data to or from the electronic system 2000.

The electronic system 2000 may be connected to an external device (e.g., a PC or a network) using the I/O device 2200 and exchange data with the external device. The I/O device 2200 may be, for example, a keypad, a keyboard, or a display. The memory 2300 may store codes and/or data for operations of the control unit 2100 and/or store data processed by the control unit 2100. The control unit 2100 and the memory 2300 may include at least one of the semiconductor packages 100, 200, 300, 400, 500, 600, 700, and 800 shown in FIGS. 1A to 12D and other semiconductor packages formed by using a method of manufacturing a semiconductor package, according to various embodiments. The interface 2400 may be a data transmission path between the electronic system 2000 and another external device. The control unit 2100, the I/O device 2200, the memory 2300, and the interface 2400 may communicate with one another through a bus 2500.

In some embodiments, the electronic system 2000 may include at least one of the semiconductor packages 100, 200, 300, 400, 500, 600, 700, and 800 shown in FIGS. 1A to 12D and other semiconductor packages formed by using a method of manufacturing a semiconductor package, according to various embodiments. Also, the electronic system 2000 may be part of a mobile phone, a portable laptop computer, an MPEG-1 audio layer 3 (MP3) player, a navigation system, a portable multimedia player (PMP), a solid-state disk (SSD), or devices for automotive and household uses.

Figure 15:
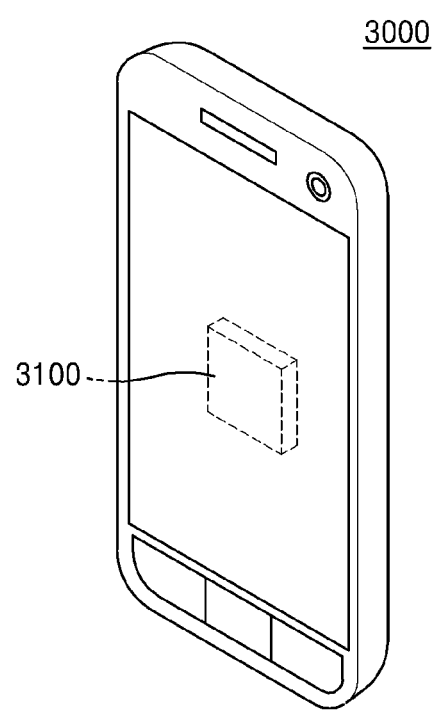
FIG. 15 is a schematic cross-sectional view of an electronic device using a semiconductor package according to some embodiments.

FIG. 15 is a schematic cross-sectional view of a mobile phone 300 as an electronic device 2000 using a semiconductor package 3100 according to some embodiments. FIG. 15 illustrates an example in which the electronic system 2000 of FIG. 14 is applied to the mobile phone 3000. The mobile phone 3000 may include the electronic system 2000 including the semiconductor package 3100. The semiconductor package 3100 may be at least one of the semiconductor packages 100, 200, 300, 400, 500, 600, 700, and 800 shown in FIGS. 1A to 12D and other semiconductor packages formed by using a method of manufacturing a semiconductor package, according to various embodiments.

An embodiment includes a semiconductor package and a method of manufacturing the same, which may effectively shield electromagnetic waves (EMW) generated by a semiconductor device to solve the above-described problem.

An embodiment includes a method of manufacturing a semiconductor package. The method includes mounting a semiconductor device on a substrate, disposing a mold on the substrate, wherein the mold is engraved to cover the semiconductor device such that at least one inner side surface of the mold has a slope, encapsulating the semiconductor device by providing a molding material in the mold, removing the mold from the substrate, and forming an electromagnetic shielding (EMS) layer to cover a top surface and side surfaces of the molding material.

The at least one inner side surface of the mold may have at least one predetermined slope.

The at least one inner side surface of the mold may have a continuous slope.

The at least one inner side surface of the mold may have a round shape.

The EMS layer may cover a side surface of the substrate.

The EMS layer may be formed by using a sputtering process, a spraying process, or a plating process.

A top thickness of the EMS layer formed on the top surface of the molding material may be substantially equal to a side thickness of the EMS layer formed on the side surfaces of the molding material.

The EMS layer may include at least one of a metal, a conductive metal-polymer composite, or metal paste.

The EMS layer may have a structure formed by sequentially stacking an adhesion layer, a conductive material layer, and a protection layer.

The substrate may include a ground layer, and the EMS layer may be electrically connected to the ground layer.

An embodiment includes a method of manufacturing a semiconductor package. The method includes mounting a plurality of semiconductor devices on a substrate, disposing a mold on the substrate, wherein the mold includes a plurality of unit molding spaces that are engraved to define the plurality of semiconductor devices, respectively, injecting a molding material into the plurality of unit molding spaces to encapsulate the plurality of semiconductor devices, removing the mold from the substrate, cutting the substrate such that the plurality of semiconductor devices encapsulated by the molding material are separated into discrete packages, and forming an electromagnetic shielding (EMS) layer to cover top surfaces and side surfaces of the discrete packages. Among the plurality of unit molding spaces, adjacent unit molding spaces are separated from one another by a plurality of walls that protrude from an inner top surface of the mold and narrow downward.

At least one of the plurality of walls may be formed apart from a top surface of the substrate.

Two adjacent unit molding spaces may communicate with each other, and the injecting of the molding material may include injecting the molding material into any one of the plurality of unit molding spaces to inject the molding material into another unit molding space adjacent thereto.

At least one of the plurality of walls may be in contact with a top surface of the substrate.

Outer surfaces of the plurality of walls may have at least one slope.

Outer surfaces of the plurality of walls may have a continuous slope.

Outer surfaces of the plurality of walls may have a round shape.

The plurality of walls may include a first wall and a second wall to define the unit molding spaces. The first wall may extend in a first direction, and the second wall may extend in a second direction that is different from the first direction. A first slope of an outer surface of the first wall may be different from a second slope of an outer surface of the second wall.

An embodiment includes a method of manufacturing a semiconductor package. The method includes mounting a semiconductor device on a substrate, disposing a mold on the substrate, wherein the mold is engraved to cover the semiconductor device such that at least one inner side surface of the mold has a slope, and encapsulating the semiconductor device by injecting a molding material into the mold.

The method may further include removing the mold from the substrate and forming an EMS layer on a top surface and a side surface of the molding material.

While embodiments have been particularly shown and described with reference to the drawings, it will be understood that various changes in form and details may be made therein without departing from the spirit and scope of the following claims.

What is claimed is:

1. A method of manufacturing a semiconductor package, the method comprising:
   mounting a semiconductor device on a substrate;
   disposing a mold on the substrate, wherein the mold is formed to cover the semiconductor device such that at least one inner side surface of the mold has a slope;
   providing a molding material into the mold to encapsulate the semiconductor device;
   removing the mold from the substrate; and
   forming an electromagnetic shielding (EMS) layer having a substantially uniform thickness to contact a top surface and side surfaces of the molding material,
   wherein one of the at least one inner side surface of the mold has at least two predetermined slopes.

2. The method of claim 1, wherein the EMS layer covers a side surface of the substrate.

3. The method of claim 1, wherein the EMS layer is electrically connected to a conductive layer of the substrate.

4. The method of claim 1, wherein the EMS layer is formed by using a sputtering process, a spraying process, or a plating process.

5. The method of claim 1, wherein the EMS layer includes at least one of a metal, a conductive metal-polymer composite, or metal paste.

6. The method of claim 1, wherein the EMS layer has a structure formed by sequentially stacking an adhesion layer, a conductive material layer, and a protection layer.

7. A method of manufacturing a semiconductor package, the method comprising:
   mounting a plurality of semiconductor devices on a substrate;

disposing a mold on the substrate, wherein the mold includes a plurality of unit molding spaces that are formed to cover the plurality of semiconductor devices, respectively;

injecting a molding material into the plurality of unit molding spaces to encapsulate the plurality of semiconductor devices;

removing the mold from the substrate;

cutting the substrate such that the plurality of semiconductor devices encapsulated by the molding material are separated into discrete packages; and forming an electromagnetic shielding (EMS) layer to cover top surfaces and side surfaces of the discrete packages, wherein, among the plurality of unit molding spaces, adjacent unit molding spaces are at least partially separated from one another by a plurality of walls that protrude from an inner top surface of the mold and narrow downward.

8. The method of claim 7, wherein at least one of the plurality of walls is formed such that when the mold is disposed on the substrate the at least one of the plurality of walls is separated from a top surface of the substrate.

9. The method of claim 7, wherein at least one of the plurality of walls is formed such that when the mold is disposed on the substrate the at least one of the plurality of walls is in contact with a top surface of the substrate.

10. The method of claim 7, wherein outer surfaces of the plurality of walls have at least one slope.

11. The method of claim 7, wherein outer surfaces of the plurality of walls have a continuous slope.

12. The method of claim 7, wherein outer surfaces of the plurality of walls have a round shape.

13. The method of claim 7, wherein:
the plurality of walls include a first wall and a second wall to define the unit molding spaces,
the first wall extends in a first direction,
the second wall extends in a second direction that is different from the first direction, and
a first slope of an outer surface of the first wall is different from a second slope of an outer surface of the second wall.

* * * * *